(12) United States Patent
Matsuura

(10) Patent No.: US 10,651,272 B2
(45) Date of Patent: May 12, 2020

(54) SEMICONDUCTOR DEVICE AND FULL-WAVE RECTIFIER CIRCUIT

(71) Applicant: UNITED SEMICONDUCTOR JAPAN CO., LTD., Kuwana-Shi, Mie (JP)

(72) Inventor: Katsuyoshi Matsuura, Kuwana (JP)

(73) Assignee: UNITED SEMICONDUCTOR JAPAN CO., LTD., Kuwana-shi (JP)

( * ) Notice: Subject to any disclaimer, the term of this patent is extended or adjusted under 35 U.S.C. 154(b) by 0 days.

(21) Appl. No.: 15/902,333

(22) Filed: Feb. 22, 2018

(65) Prior Publication Data

US 2018/0269286 A1    Sep. 20, 2018

(30) Foreign Application Priority Data

Mar. 14, 2017   (JP) ................ 2017-048619

(51) Int. Cl.
| | |
|---|---|
| H01L 29/06 | (2006.01) |
| H01L 29/861 | (2006.01) |
| H02M 7/06 | (2006.01) |
| H01L 27/08 | (2006.01) |
| H01L 29/66 | (2006.01) |

(52) U.S. Cl.
CPC ...... *H01L 29/0692* (2013.01); *H01L 27/0814* (2013.01); *H01L 29/0607* (2013.01); *H01L 29/0649* (2013.01); *H01L 29/66136* (2013.01); *H01L 29/861* (2013.01); *H01L 29/8611* (2013.01); *H02M 7/06* (2013.01)

(58) Field of Classification Search
CPC ............. H01L 29/0692; H01L 29/8611; H01L 29/0649; H01L 27/0814; H01L 29/66136; H01L 29/861; H01L 29/0607; H02M 7/06
USPC ........................................... 257/629
See application file for complete search history.

(56) References Cited

U.S. PATENT DOCUMENTS

| | | | | |
|---|---|---|---|---|
| 3,740,581 A | * | 6/1973 | Pfiffner ................ | H03K 17/567 327/377 |
| 4,747,751 A | * | 5/1988 | Guillemot ........... | F04D 15/0218 417/36 |
| 6,049,234 A | * | 4/2000 | Miyashita ............ | H04M 11/002 327/24 |
| 2001/0038139 A1 | | 11/2001 | Takiguchi | |
| 2005/0184361 A1 | | 8/2005 | Sasaki | |
| 2006/0131661 A1 | | 6/2006 | Goshima et al. | |
| 2006/0273403 A1 | | 12/2006 | Suzuki et al. | |
| 2008/0023767 A1 | * | 1/2008 | Voldman ............. | H01L 27/0255 257/355 |

(Continued)

FOREIGN PATENT DOCUMENTS

| | | |
|---|---|---|
| JP | 6-224214 A | 8/1994 |
| JP | 11-121459 A | 4/1999 |

(Continued)

*Primary Examiner* — Hrayr A Sayadian
(74) *Attorney, Agent, or Firm* — Westerman, Hattori, Daniels & Adrian, LLP

(57) ABSTRACT

One aspect of a semiconductor device includes a plurality of first structures, in which each of the first structures includes: a first N-type region; a P-type region which is surrounded by the first N-type region; and a second N-type region which is surrounded by the P-type region. The first N-type region and the P-type region are wired, and the plurality of first structures are connected in parallel to form one diode.

10 Claims, 37 Drawing Sheets

(56) References Cited

U.S. PATENT DOCUMENTS

| | | | |
|---|---|---|---|
| 2012/0043643 A1* | 2/2012 | Chang | H01L 27/0259 257/557 |
| 2018/0269286 A1* | 9/2018 | Matsuura | H01L 29/0692 |

FOREIGN PATENT DOCUMENTS

| JP | 2001-267327 A | 9/2001 |
|---|---|---|
| JP | 2005-44956 A | 2/2005 |
| JP | 2005-191263 A | 7/2005 |
| JP | 2005-236084 A | 9/2005 |
| JP | 2006-100308 A | 4/2006 |
| JP | 2006-339393 A | 12/2006 |
| JP | 2012-44164 A | 3/2012 |
| JP | 2015-103605 A | 6/2015 |

* cited by examiner

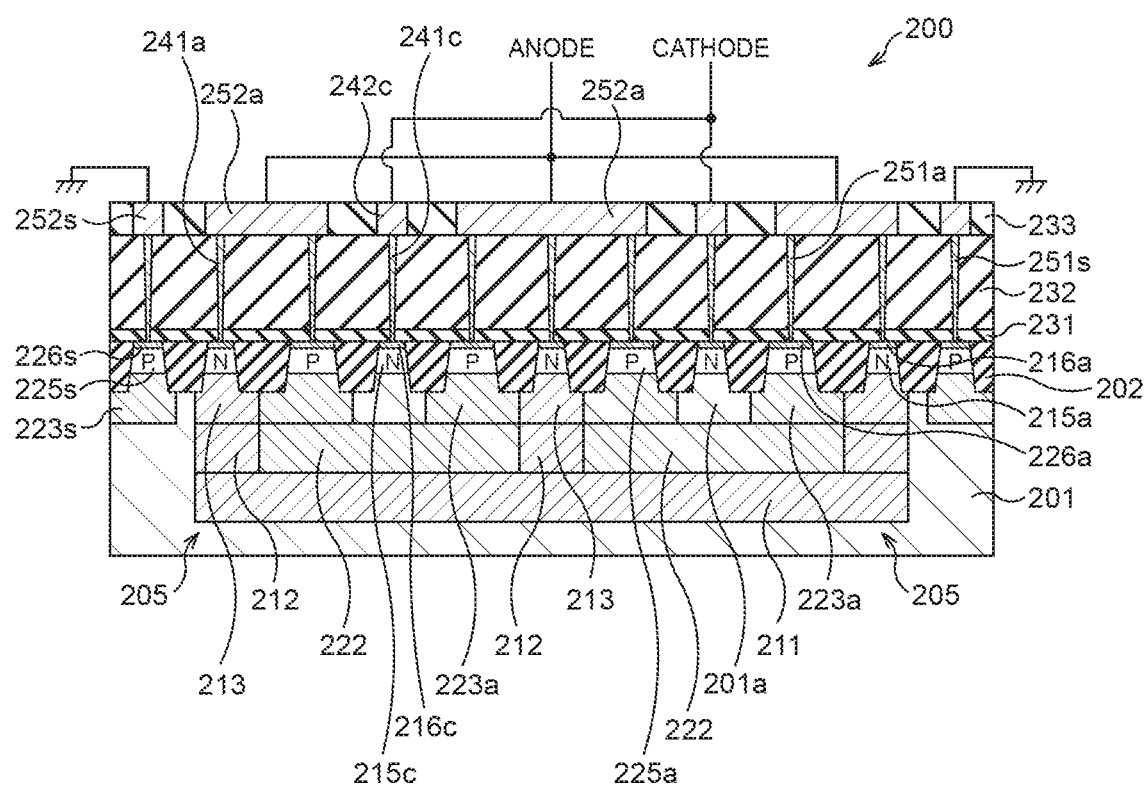

SEMICONDUCTOR DEVICE AND FULL-WAVE RECTIFIER CIRCUIT

CROSS-REFERENCE TO RELATED APPLICATION

This application is based upon and claims the benefit of priority of the prior Japanese Patent Application No. 2017-048619, filed on Mar. 14, 2017, the entire contents of which are incorporated herein by reference.

FIELD

The embodiments discussed herein are directed to a semiconductor device and a full-wave rectifier circuit.

BACKGROUND

A non-contact IC card does not include a power supply therein, and makes a built-in circuit operate by receiving an electric power supplied by an external radio wave. Generally, an AC magnetic field of 13.56 MHz is externally supplied to such a non-contact IC card, and rectified to a DC power supply by a full-wave rectifier circuit built in the non-contact IC card, to be used as an internal power supply. The full-wave rectifier circuit normally includes a bridge circuit formed of four diodes, and with respect to a magnetic field supplied to an antenna formed of an inductance element such as a coil, the inductance element generates an induced current, and the induced current is supplied to the bridge circuit. The induced current is an AC current whose polarity is inverted in accordance with a polarity inversion of the magnetic field, and thus is rectified to a DC current by a rectifier circuit formed of the bridge circuit.

The diode forming the full-wave rectifier circuit is structured through PN junction in a P-well formed in a P-type substrate. The P-well is formed in an N-well for the purpose of being electrically separated from the P-type substrate. Specifically, there is provided a triple-well structure in which the P-well in which the diode is formed is formed in the N-well formed in the P-type substrate. Regarding the diode with triple-well structure, there has been proposed a technology aiming to suppress a generation of a substrate current.

However, in a full-wave rectifier circuit including a bridge circuit formed of conventional diodes, including diodes aiming to suppress the generation of the substrate current, as a frequency of an input signal increases, a rectification characteristic is likely to be reduced.

Patent Document 1: Japanese Laid-open Patent Publication No. 2012-44164
Patent Document 2: Japanese Laid-open Patent Publication No. 2005-44956
Patent Document 3: Japanese Laid-open Patent Publication No. 2005-236084
Patent Document 4: Japanese Laid-open Patent Publication No. 2005-191263
Patent Document 5: Japanese Laid-open Patent Publication No. 11-121459
Patent Document 6: Japanese Laid-open Patent Publication No. 06-224214
Patent Document 7: Japanese Laid-open Patent Publication No. 2001-267327
Patent Document 8: Japanese Laid-open Patent Publication No. 2015-103605
Patent Document 9: Japanese Laid-open Patent Publication No. 2006-100308
Patent Document 10: Japanese Laid-open Patent Publication No. 2006-339393

SUMMARY

One aspect of a semiconductor device includes a plurality of first structures, in which each of the first structures includes: a first N-type region; a P-type region which is surrounded by the first N-type region; and a second N-type region which is surrounded by the P-type region. The first N-type region and the P-type region are wired, and the plurality of first structures are connected in parallel to form one diode.

One aspect of a full-wave rectifier circuit includes four diodes which are connected in a bridge configuration. At least one of the four diodes includes a plurality of first structures, in which each of the first structures includes: a first N-type region; a P-type region which is surrounded by the first N-type region; and a second N-type region which is surrounded by the P-type region. The first N-type region and the P-type region are wired, and the plurality of first structures are connected in parallel to form one diode.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 9 is a sectional view illustrating a configuration of the semiconductor device according to the second embodiment;

DESCRIPTION OF EMBODIMENTS

Reference Example

Figure 1A:
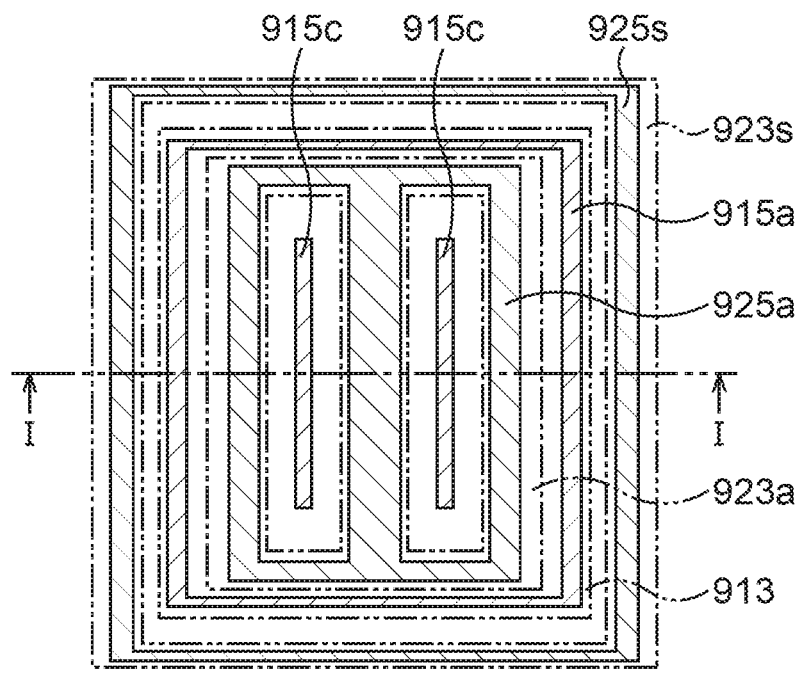
FIG. 1A and FIG. 1B are diagrams illustrating a layout of impurity diffusion layers and wells in a reference example.
Figure 1B:
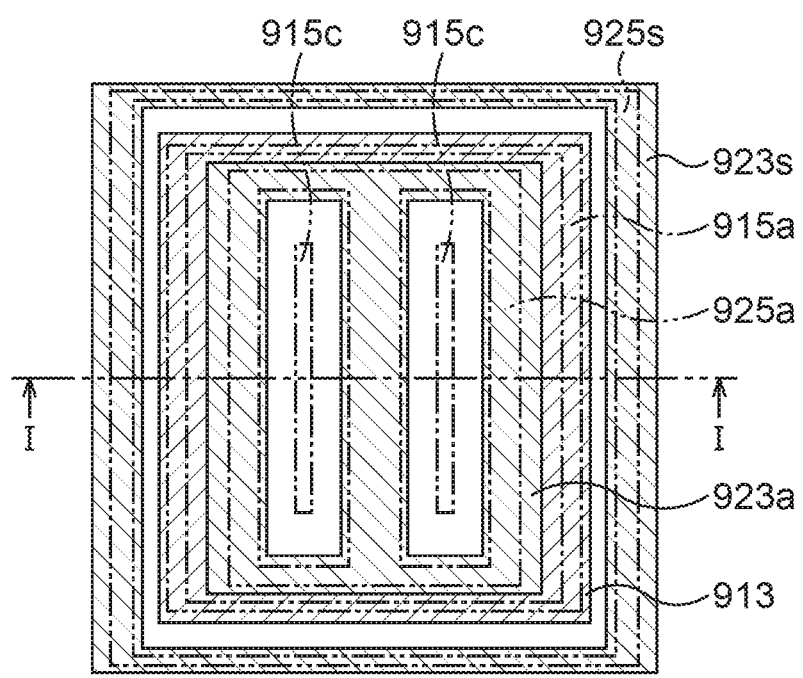
Figure 2:
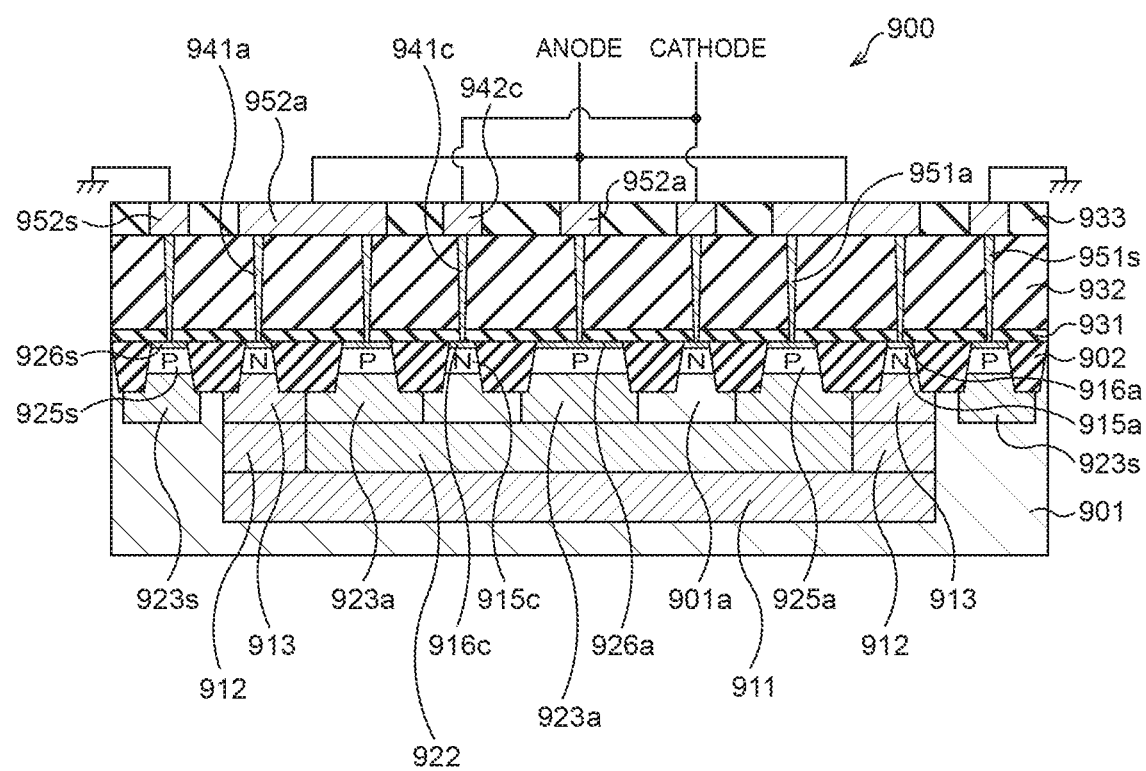
FIG. 2 is a sectional view illustrating a configuration of the reference example.

First, a reference example of a diode with a triple-well structure capable of suppressing a generation of a substrate current will be described. In this reference example, a finger structure is employed from a viewpoint of reducing a maximum size of a P-type impurity diffusion layer and an N-type impurity diffusion layer in a P well. Specifically, a plurality of N-type impurity diffusion layers are formed to be parallel to each other on a surface of a P-type substrate, and these are connected in common to be used as a cathode. FIG. 1A and FIG. 1B are diagrams illustrating a layout of impurity diffusion layers and wells in the reference example. FIG. 2 is a sectional view illustrating a configuration of the reference example. FIG. 2 corresponds to a sectional view taken along a line I-I in FIG. 1A and FIG. 1B.

As illustrated in FIGS. 1A and 1B and FIG. 2, a diode 900 of the reference example includes an N-well 911, an N-well 912, an N-well 913, a P-well 922, and a P-well 923a formed on a P-type substrate 901. The N-well 912 is annularly formed on an outer peripheral portion of the N-well 911 having a substantially rectangular planar shape, and the N-well 913 is formed on the N-well 912. An N-type impurity diffusion layer 915a is formed on the N-well 913. The P-well 922 is formed on the N-well 911, at a position on the inside of the N-well 912 in plan view, and the P-well 923a includes a peripheral edge portion annularly formed on an outer peripheral portion of the P-well 922, and a center portion which divides the peripheral portion in two. A P-type impurity diffusion layer 925a is formed on the P-well 923a. At a position on the P-well 922 and on the inside of the P-well 923a in plan view, there is a portion 901a of the P-type substrate 901, and an N-type impurity diffusion layer 915c is formed on the portion 901a.

On a surface of the P-type substrate 901, a P-well 923s and a P-type impurity diffusion layer 925s are formed by being separated from the N-well 911 in plan view. The P-well 923s is formed to have a depth same as that of the P-well 923a, and the P-type impurity diffusion layer 925s is formed on the P-well 923s.

An element isolation region 902 is formed between adjacent impurity diffusion layers having different conductivity types. A silicide layer 916c is formed on the N-type impurity diffusion layer 915c, a silicide layer 916a is formed on the N-type impurity diffusion layer 915a, a silicide layer 926a is formed on the P-type impurity diffusion layer 925a, and a silicide layer 926s is formed on the P-type impurity diffusion layer 925s. On the silicide layers 916a, 916c, 926a, and 926s, and the element isolation regions 902, a silicon nitride film 931 and a silicon oxide film 932 are formed, and conductive plugs 941a, 941c, 951a, and 951s are formed in the silicon nitride film 931 and the silicon oxide film 932.

The conductive plug 941a is connected to the silicide layer 916a, the conductive plug 941c is connected to the silicide layer 916c, the conductive plug 951a is connected to the silicide layer 926a, and the conductive plug 951s is connected to the silicide layer 926s. A silicon oxide film 933 is formed on the silicon oxide film 932, and wires 942c, 952a, and 952s are formed in the silicon oxide film 933. The wire 942c is connected to the conductive plug 941c, the wire 952a is connected to the conductive plugs 941a and 951a, and the wire 952s is connected to the conductive plug 951s. Specifically, the N-type impurity diffusion layer 915a and the P-type impurity diffusion layer 925a are wired through the wire 952a.

When the diode 900 as described above is used in a full-wave rectifier circuit, it is possible to suppress a substrate current.

However, when the present inventor conducted studies regarding characteristics of the full-wave rectifier circuit using the diode 900, it was clarified that when a frequency of an input signal is a high frequency such as one exceeding 10 MHz, as a finger number increases, an input loss becomes significantly large.

Figure 3A:
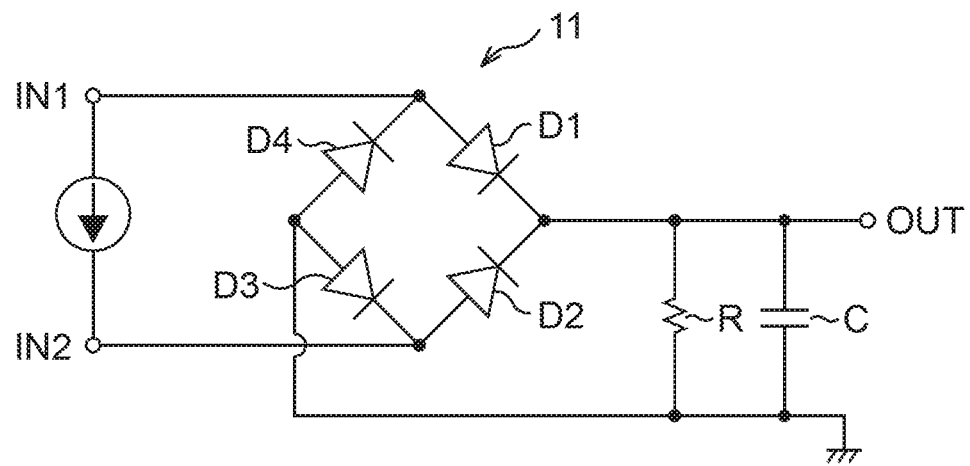
FIG. 3A is a diagram illustrating a full-wave rectifier circuit.
Figure 3B:
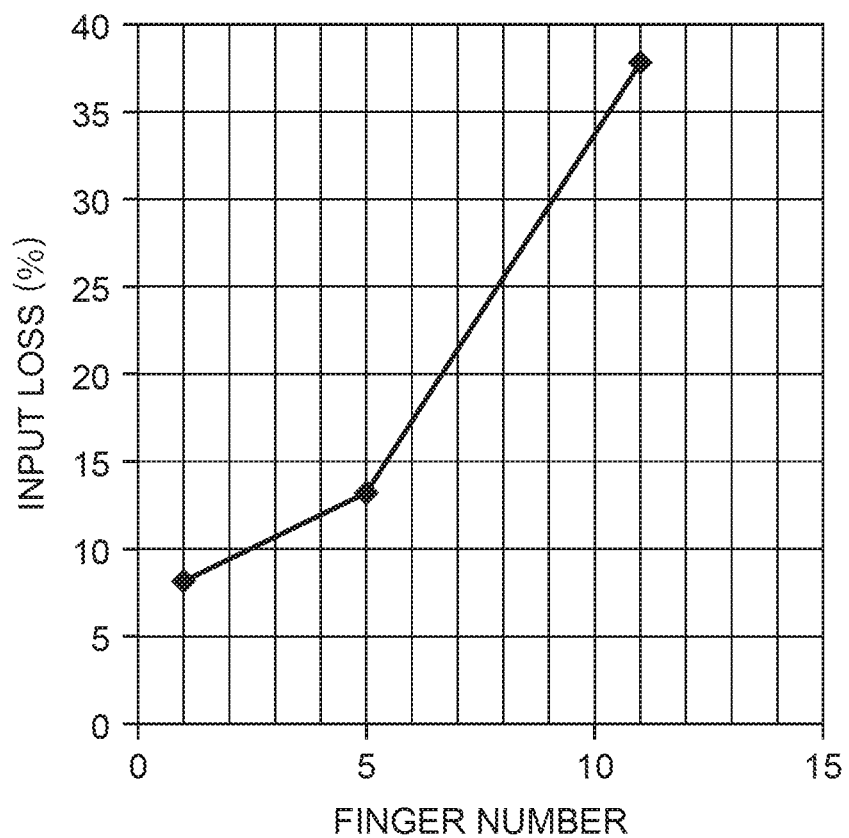
FIG. 3B is a diagram illustrating a result of simulation regarding the reference example.

The full-wave rectifier circuit will be described. FIG. 3A and FIG. 3B are a diagram illustrating a full-wave rectifier circuit and a diagram illustrating a result of simulation regarding the reference example. FIG. 3A is a circuit diagram illustrating a configuration of the full-wave rectifier circuit, and FIG. 3B is a diagram illustrating a relationship between a finger number and an input loss in the reference example.

As illustrated in FIG. 3A, the full-wave rectifier circuit includes a bridge circuit 11 formed of, for example, four diodes D1, D2, D3, and D4. An input terminal IN1 is connected between a cathode of the diode D4 and an anode of the diode D1, and an input terminal IN2 is connected between a cathode of the diode D3 and an anode of the diode D2. An anode of the diode D3 and an anode of the diode D4 are grounded, and a cathode of the diode D1 and a cathode of the diode D2 are connected to an output terminal OUT. At a position between the output terminal OUT and the ground, a resistor element R and a capacitor element C are connected to be parallel to each other.

When a bias applied to the diode is changed from a forward bias to a reverse bias, a negative current flows for a certain period of time right after the switching. A process in which the negative current flows as above is called as a reverse recovery process. In the reverse recovery process, a depletion layer extends greatly, and a carrier is drawn out in accordance with the depletion, resulting in that a negative current flows. Therefore, a period of time of the reverse recovery process depends on an amount of accumulated electric charge during when the forward bias is applied, and increases as a forward current increases. In the full-wave rectifier circuit, a negative current flows in each diode right after the bias is switched from the forward bias to the reverse bias. For example, in the full-wave rectifier circuit in FIG. 3A, currents which flow through the diodes D1 and D2 are deviated by half cycle, and since negative currents caused by the reverse recovery process flow through both of the diodes, a waveform of an output signal being the sum of the currents is rounded, which causes an input loss.

FIG. 3B illustrates a simulation result of an input loss when the diode with the layout as in the reference example is used for each of the diodes D1 to D4 in the full-wave rectifier circuit in FIG. 3A. In the diode 900 of the reference example, the finger number, namely, the number of the N-type impurity diffusion layers 915c is two, but, FIG. 3B illustrates a result when the finger number is 1, 5, or 11. In this simulation, a resistance of the resistor element R is set to 539Ω, a capacitance of the capacitor element C is set to 200 pF, and an alternating current having a frequency of 13.56 MHz and a maximum value of 70 mA is applied between the input terminals IN1 and IN2. When an integral value of one cycle of a current which flows through an AC power supply between the input terminals IN1 and IN2 is set to $I_0$, and an integral value of one cycle of a current which flows through the resistor element R is set to $I_1$, the input loss is represented by "$(I_0-I_1)/I_0$".

As illustrated in FIG. 3B, the input loss greatly increases in accordance with the increase in the finger number. In particular, the input loss increases significantly in a high-frequency band in which a frequency of an input signal exceeds 10 MHz.

The present inventor conducted studies for investigating a cause thereof. As a result of this, it was clarified that in the diode 900 with the finger structure, there exists an NPN bipolar transistor in which the N-type impurity diffusion layer 915c is set to an emitter, the P-well 922 is set to a base, and the N-well 911 is set to a collector, and when a total area of the N-type impurity diffusion layer 915c is constant, a collector resistance increases as a finger number is larger. The P-type impurity diffusion layer 925a and the N-type impurity diffusion layer 915a are electrically connected through the wire 952a, and the base and the collector are electrically connected. For this reason, in the NPN bipolar transistor which includes the N-type impurity diffusion layer 915c closer to a center, among a plurality of N-type impurity diffusion layers 915c, a current direction between the base and the collector becomes a forward direction due to a voltage drop caused by the collector resistance, resulting in that the current becomes difficult to flow. Therefore, if voltages between respective emitters and bases are equal, the NPN bipolar transistor closer to the center has a smaller current. When the voltage between the emitter and the base is increased, it is possible to make a nearly equal current flow between the center portion and a peripheral edge portion. However, this leads to increase in an amount of accumulated electric charge in the base, and thus a current which flows in the reverse recovery process increases. Based on such a mechanism, the present inventor found out that in the conventional diode with the finger structure, when the total areas of the N-type impurity diffusion layers are the same, the input loss significantly increases in accordance with the increase in the finger number. Further, as a frequency of an input signal is higher, a frequency of the reverse recovery process increases while an input current per unit time remains constant, so that the input loss increases.

As a result of earnest studies conducted by the present inventor in order to improve such a reference example, the present inventor arrived at the following various embodiments.

First Embodiment

Figure 4A:
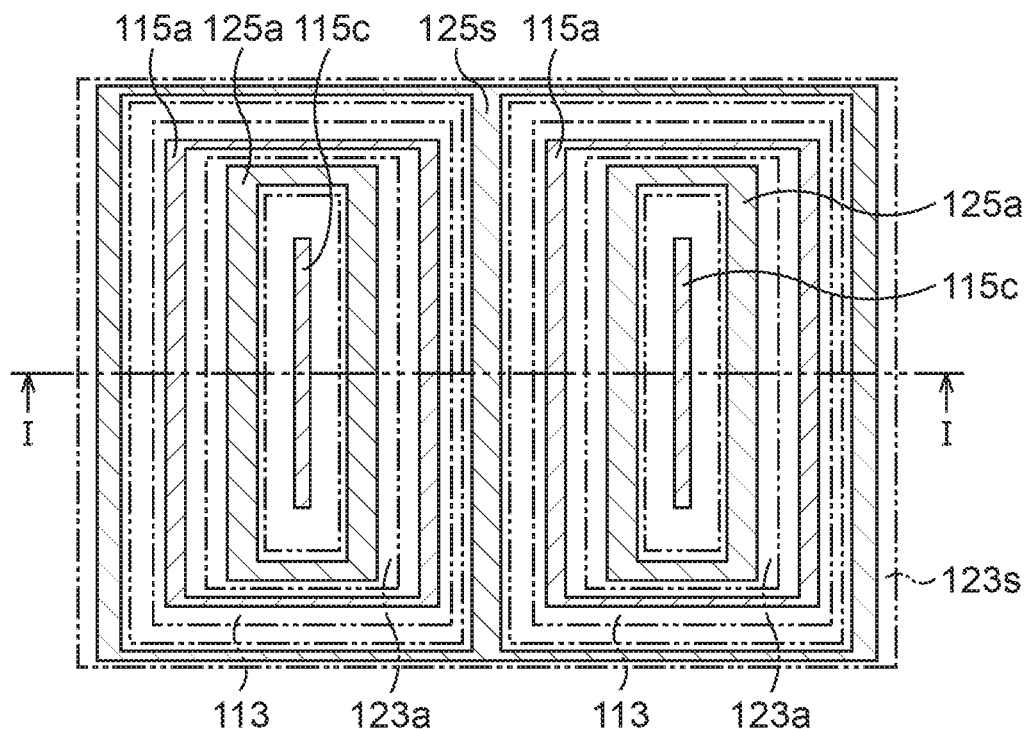
FIG. 4A and FIG. 4B are diagrams illustrating a layout of impurity diffusion layers and wells in a semiconductor device according to a first embodiment.
Figure 4B:
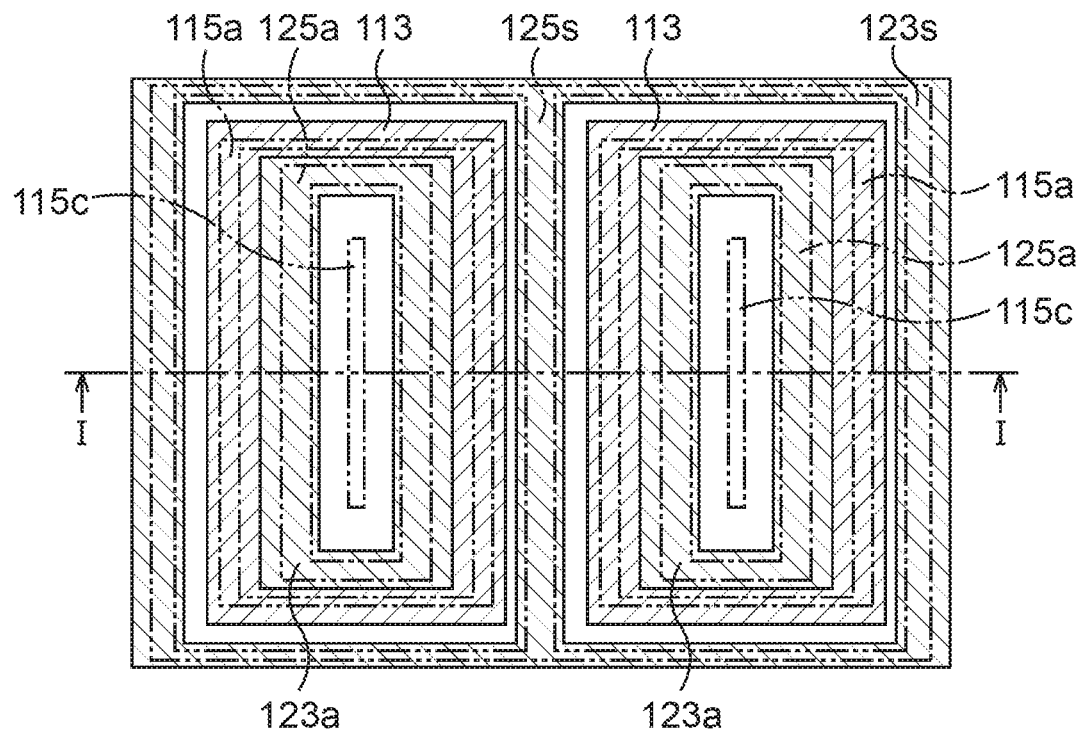
Figure 5:
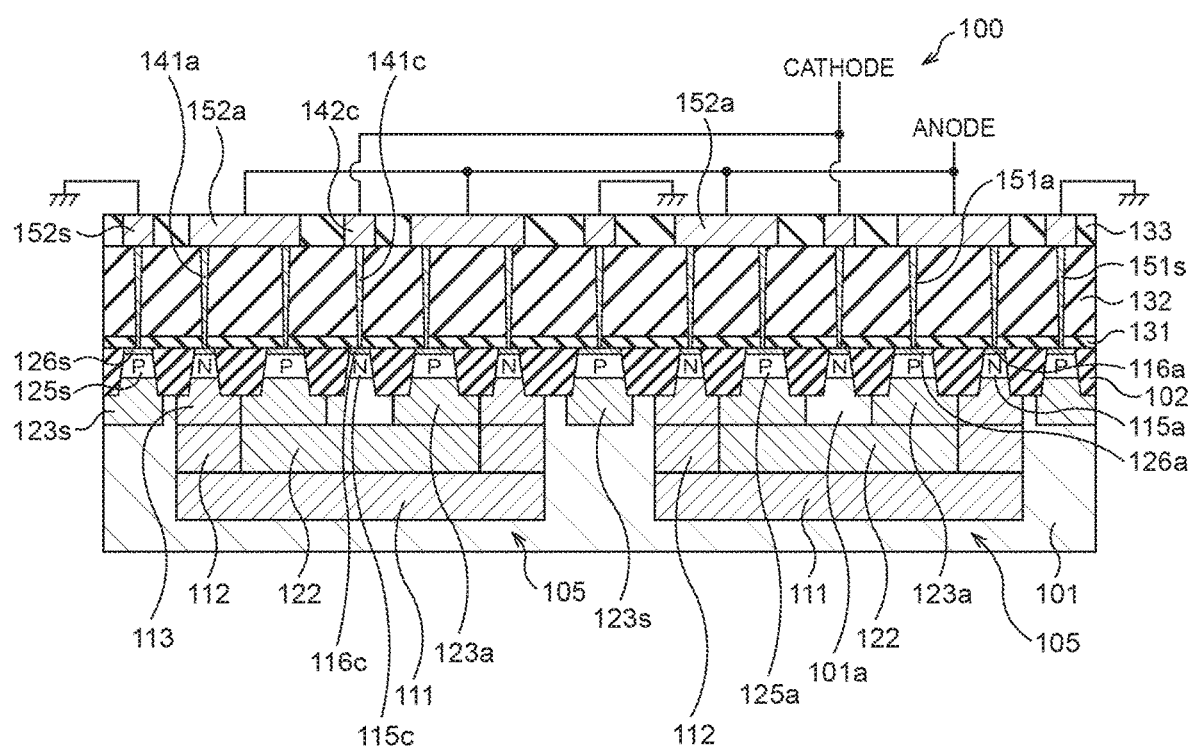
FIG. 5 is a sectional view illustrating a configuration of the semiconductor device according to the first embodiment.

Next, a first embodiment will be described. The first embodiment relates to a semiconductor device including a diode. FIG. 4A and FIG. 4B are diagrams illustrating a layout of impurity diffusion layers and wells in the semiconductor device according to the first embodiment. FIG. 5 is a sectional view illustrating a configuration of the semiconductor device according to the first embodiment. FIG. 5 corresponds to a sectional view taken along a line I-I in FIG.

Figure 6:
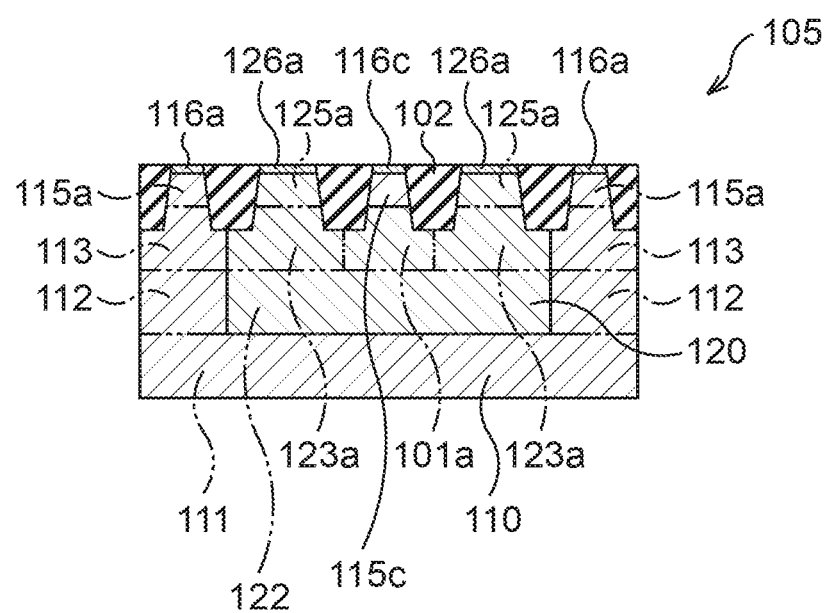
FIG. 6 is a sectional view illustrating a first structure included in the semiconductor device according to the first embodiment.

4A and FIG. 4B. FIG. 6 is a sectional view illustrating a first structure included in the semiconductor device according to the first embodiment.

As illustrated in FIGS. 4A and 4B and FIG. 5, the semiconductor device according to the first embodiment includes a plurality of first structures 105 formed on a P-type substrate 101. As illustrated in FIG. 6, each of the first structures 105 includes a first N-type region 110, a P-type region 120 surrounded by the first N-type region 110, and an N-type impurity diffusion layer 115c surrounded by the P-type region 120. The N-type region 110 includes an N-well 111, an N-well 112, an N-well 113, and an N-type impurity diffusion layer 115a, the P-type region 120 includes a P-well 122, a P-well 123a, and a P-type impurity diffusion layer 125a, and a portion 101a of the P-type substrate 101 is also included in the P-type region 120. For each of the first structures 105, the N-well 112 is annularly formed on an outer peripheral portion of the N-well 111 having a substantially rectangular planar shape, the N-well 113 is formed on the N-well 112, and the N-type impurity diffusion layer 115a is formed on the N-well 113. The P-well 122 is formed on the N-well 111, at a position on the inside of the N-well 112 in plan view, the P-well 123a is annularly formed on an outer peripheral portion of the P-well 122, and the P-type impurity diffusion layer 125a is formed on the P-well 123a. At a position on the P-well 122 and on the inside of the P-well 123a in plan view, there is the portion 101a of the P-type substrate 101. The N-type impurity diffusion layer 115c is formed on the portion 101a of the P-type substrate 101. The N-type impurity diffusion layer 115c is one example of a second N-type region.

On a surface of the P-type substrate 101, a P-well 123s and a P-type impurity diffusion layer 125s are formed by being separated from the first structure 105. The P-well 123s is formed to have a depth same as that of the P-well 123a, and the P-type impurity diffusion layer 125s is formed on the P-well 123s.

An element isolation region 102 is formed between adjacent impurity diffusion layers having different conductivity types. A silicide layer 116c is formed on the N-type impurity diffusion layer 115c, a silicide layer 116a is formed on the N-type impurity diffusion layer 115a, a silicide layer 126a is formed on the P-type impurity diffusion layer 125a, and a silicide layer 126s is formed on the P-type impurity diffusion layer 125s. On the silicide layers 116a, 116c, 126a, and 126s, and the element isolation regions 102, a silicon nitride film 131 and a silicon oxide film 132 are formed, and conductive plugs 141a, 141c, 151a, and 151s are formed in the silicon nitride film 131 and the silicon oxide film 132. The conductive plug 141a is connected to the silicide layer 116a, the conductive plug 141c is connected to the silicide layer 116c, the conductive plug 151a is connected to the silicide layer 126a, and the conductive plug 151s is connected to the silicide layer 126s. A silicon oxide film 133 is formed on the silicon oxide film 132, and wires 142c, 152a, and 152s are formed in the silicon oxide film 133. The wire 142c is connected to the conductive plug 141c, the wire 152a is connected to the conductive plugs 141a and 151a, and the wire 152s is connected to the conductive plug 151s. Specifically, in each of the first structures 105, the N-type region 110 and the P-type region 120 are wired through the wire 152a.

Between the plurality of first structures 105, the wires 142c are connected in common, and the wires 152a are connected in common. Specifically, between the plurality of first structures 105, pairs each formed of the N-type region 110 and the P-type region 120 are mutually connected in common, and the N-type impurity diffusion layers 115c are mutually connected in common. In a manner as described above, the plurality of first structures 105 are connected in parallel to form one diode 100.

In the semiconductor device according to the first embodiment, the P-type region 120 is surrounded by the first N-type region 110 in each of the first structures 105, so that a collector resistance in the diode 100 is not influenced by the number of the first structures 105. Therefore, a sufficient current flows even if a voltage between an emitter and a base is not increased, resulting in that it is possible to suppress an increase in an amount of accumulated electric charge in the base in accordance with an increase in the voltage between the emitter and the base, to thereby suppress an input loss.

Next, a manufacturing method of the semiconductor device according to the first embodiment will be described. FIG. 7A to FIG. 7L are sectional views illustrating the manufacturing method of the semiconductor device according to the first embodiment in the order of processes.

Figure 7A:
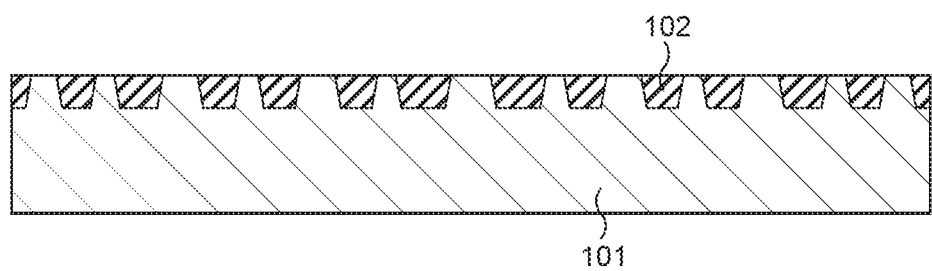
FIG. 7A is sectional views illustrating a manufacturing method of the semiconductor device according to the first embodiment in the order of processes.

First, as illustrated in FIG. 7A, element isolation regions 102 are formed on a surface of a substrate 101. The substrate 101 is a P-type silicon substrate, for example. The element isolation regions 102 can be formed through shallow trench isolation (STI), for example.

Figure 7B:
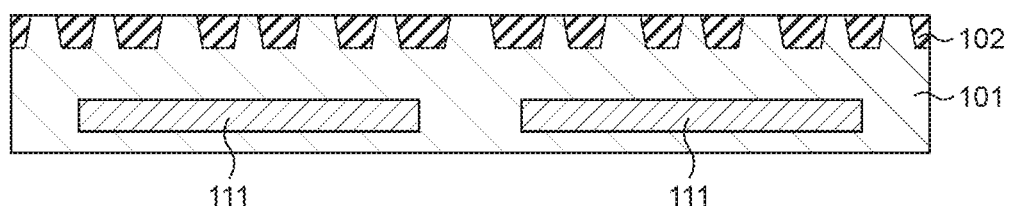
FIG. 7B is sectional views illustrating a manufacturing method of the semiconductor device according to the first embodiment in the order of processes continued from FIG. 7A.

Next, as illustrated in FIG. 7B, N-wells 111 are formed in the substrate 101. In the formation of the N-wells 111, an ion implantation of phosphorous (P) is performed at an implantation energy of 2 MeV to 4 MeV and a dose amount of $1.5 \times 10^{13}$ cm$^{-2}$ to $2.5 \times 10^{13}$ cm$^{-2}$, for example. An upper end of the N-well 111 having an impurity concentration of $1 \times 10^{16}$ cm$^{-3}$ or more is positioned at a depth of 1.37 μm to 2.46 μm from the surface of the substrate 101, and a lower end of the N-well 111 is positioned at a depth of 4.15 μm to 5.80 μm from the surface of the substrate 101.

Figure 7C:
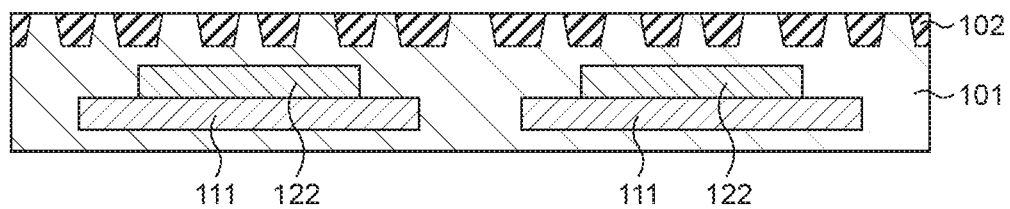
FIG. 7C is sectional views illustrating a manufacturing method of the semiconductor device according to the first embodiment in the order of processes continued from FIG. 7B.

After that, as illustrated in FIG. 7C, D-wells 122 are formed on the N-wells 111. In the formation of the P-wells 122, an ion implantation of boron (B) is performed at an implantation energy of 800 keV to 1000 keV and a dose amount of $0.5 \times 10^{13}$ cm$^{-2}$ to $1.5 \times 10^{13}$ cm$^{-2}$, for example. An upper end of the P-well 122 having an impurity concentration of $1 \times 10^{16}$ cm$^{-3}$ or more is positioned at a depth of 1.06 μm to 1.47 μm from the surface of the substrate 101, and a lower end of the P-well 122 is positioned at a depth of 2.05 μm to 2.31 μm from the surface of the substrate 101.

Figure 7D:
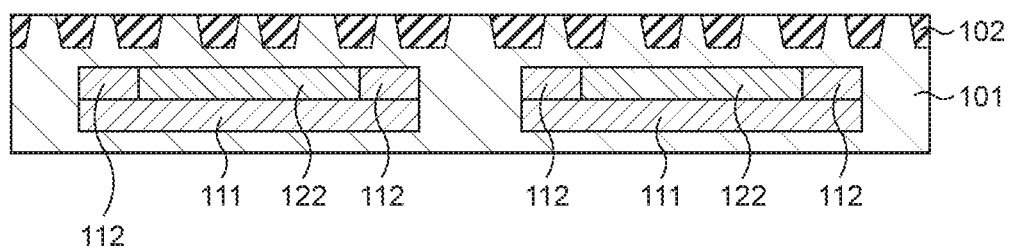
FIG. 7D is sectional views illustrating a manufacturing method of the semiconductor device according to the first embodiment in the order of processes continued from FIG. 7C.

Subsequently, as illustrated in FIG. 7D, N-wells 112 are formed on the N-wells 111. In the formation of the N-wells 112, an ion implantation of P is performed at an implantation energy of 600 keV to 800 keV and a dose amount of $1.0 \times 10^{13}$ cm$^{-2}$ to $2.0 \times 10^{13}$ cm$^{-2}$, for example. An upper end of the N-well 112 having an impurity concentration of $1 \times 10^{16}$ cm$^{-3}$ or more is positioned at a depth of 0.25 μm to 0.51 μm from the surface of the substrate 101, and a lower end of the N-well 112 is positioned at a depth of 2.05 μm to 2.43 μm from the surface of the substrate 101.

Figure 7E:
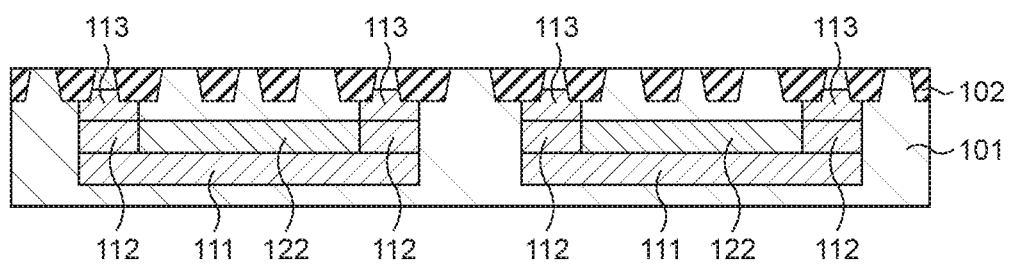
FIG. 7E is sectional views illustrating a manufacturing method of the semiconductor device according to the first embodiment in the order of processes continued from FIG. 7D.

Next, as illustrated in FIG. 7E, N-wells 113 are formed on the N-wells 112. In the formation of the N-wells 113, an ion implantation of P is performed at an implantation energy of 300 keV to 400 keV and a dose amount of $2.0 \times 10^{13}$ cm$^{-2}$ to $4.0 \times 10^{13}$ cm$^{-2}$, for example. An upper end of the N-well 113 having an impurity concentration of $1 \times 10^{16}$ cm$^{-3}$ or more is positioned at a depth of 0.00 μm from the surface of the substrate 101, and a lower end of the N-well 113 is positioned at a depth of 0.84 μm to 1.07 μm from the surface of the substrate 101.

Figure 7F:
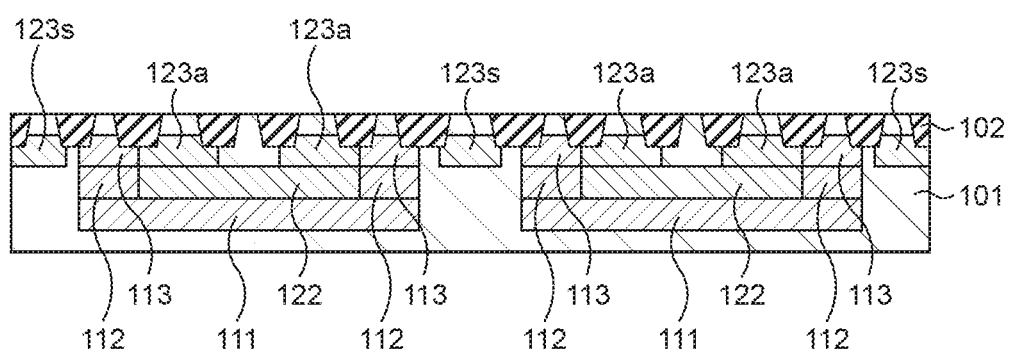
FIG. 7F is sectional views illustrating a manufacturing method of the semiconductor device according to the first embodiment in the order of processes continued from FIG. 7E.

After that, as illustrated in FIG. 7F, D-wells 123a are formed on the P-wells 122, and a P-well 123s is formed to have a depth same as that of the P-well 123a. In the formation of the P-wells 123a and 123s, an ion implantation of B is performed at an implantation energy of 100 keV to 200 keV and a dose amount of $2.0 \times 10^{13}$ cm$^{-2}$ to $4.0 \times 10^{13}$ cm$^{-2}$, for example. An upper end of each of the P-wells 123a and 123s having an impurity concentration of $1 \times 10^{16}$ cm$^{-3}$ or more is positioned at a depth of 0.00 μm to 0.13 μm from the surface of the substrate 101, and a lower end of each of the P-wells 123a and 123s is positioned at a depth of 0.68 μm to 1.05 μm from the surface of the substrate 101. After the impurities are ion-implanted into the substrate 101, annealing called as well-annealing is performed. The well-annealing is performed for the purpose of obtaining a predetermined impurity concentration profile by causing thermal diffusion of the ion-implanted impurities, and is carried out for about 10 seconds at a high temperature of about 1000° C., for example. Even in a case where, for example, regions of mutual wells are not overlapped in a depth direction right after the implantation, it is possible to perform control to make the regions to be overlapped, through the thermal diffusion of the impurities.

Figure 7G:
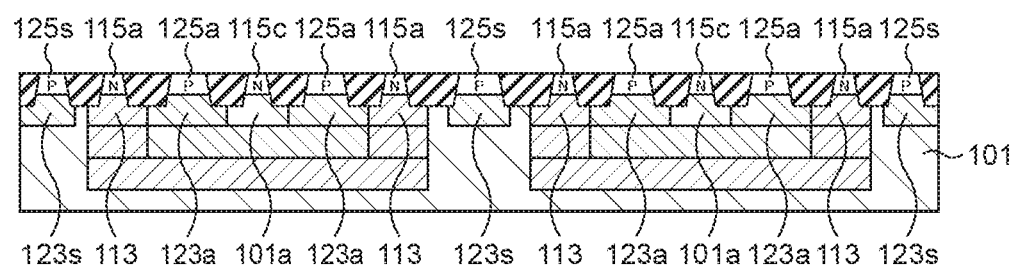
FIG. 7G is sectional views illustrating a manufacturing method of the semiconductor device according to the first embodiment in the order of processes continued from FIG. 7F.

Subsequently, as illustrated in FIG. 7G, N-type impurity diffusion layers 115a are formed on the N-wells 113, N-type impurity diffusion layers 115c are formed on portions 101a of the substrate 101, P-type impurity diffusion layers 125a are formed on the P-wells 123a, and a P-type impurity diffusion layer 125s is formed on the P-well 123s. In the formation of the N-type impurity diffusion layers 115a and 115c, an ion implantation of P is performed at an implantation energy of 6 keV to 10 keV and a dose amount of $1.0 \times 10^{16}$ cm$^{-2}$ to $1.5 \times 10^{16}$ cm$^{-2}$, for example. In the formation of the P-type impurity diffusion layers 125a and 125s, an ion implantation of B is performed at an implantation energy of 6 keV to 10 keV and a dose amount of $0.8 \times 10^{13}$ cm$^{-2}$ to $1.2 \times 10^{13}$ cm$^{-2}$, an ion implantation of germanium (Ge) is performed at an implantation energy of 15 keV to 25 keV and a dose amount of $3.0 \times 10^{14}$ cm$^{-2}$ to $7.0 \times 10^{14}$ cm$^{-2}$, an ion implantation of B is performed at an implantation energy of 2 keV to 6 keV and a dose amount of $4.0 \times 10^{15}$ cm$^{-2}$ to $8.0 \times 10^{15}$ cm$^{-2}$, and an ion implantation of fluorine (F) is performed at an implantation energy of 5 keV to 9 keV and a dose amount of $3.0 \times 10^{14}$ cm$^{-2}$ to $7.0 \times 10^{14}$ cm$^{-2}$, for example. Further, by performing rapid heat treatment called as spike annealing, the entire impurity diffusion region is activated. The spike annealing is performed, for example, at a temperature of about 1000° C. for a short period of time in which the temperature is raised rapidly such that a standby time to achieve high temperature is about 0 seconds and the temperature is lowered rapidly.

Figure 7H:
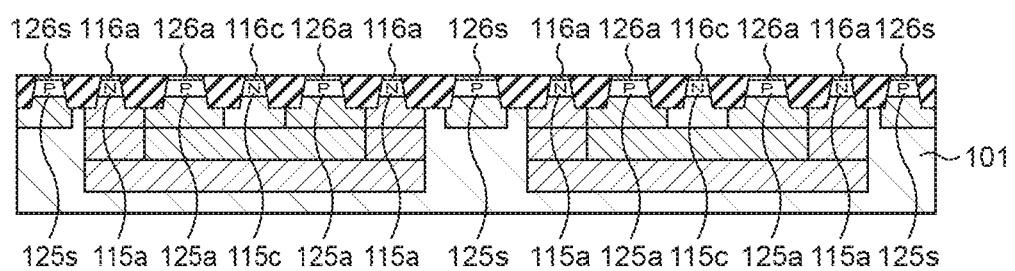
FIG. 7H is sectional views illustrating a manufacturing method of the semiconductor device according to the first embodiment in the order of processes continued from FIG. 7G.

Next, as illustrated in FIG. 7H, silicide layers 116a are formed on the N-type impurity diffusion layers 115a, silicide layers 116c are formed on the N-type impurity diffusion layers 115c, silicide layers 126a are formed on the P-type impurity diffusion layers 125a, and a silicide layer 126s is formed on the P-type impurity diffusion layer 125s. As the silicide layers 116a, 116c, 126a, and 126s, for example, silicide layers each made of molybdenum (Mo), tungsten (W), titanium (Ti), cobalt (Co), or nickel (Ni) are formed.

Figure 7I:
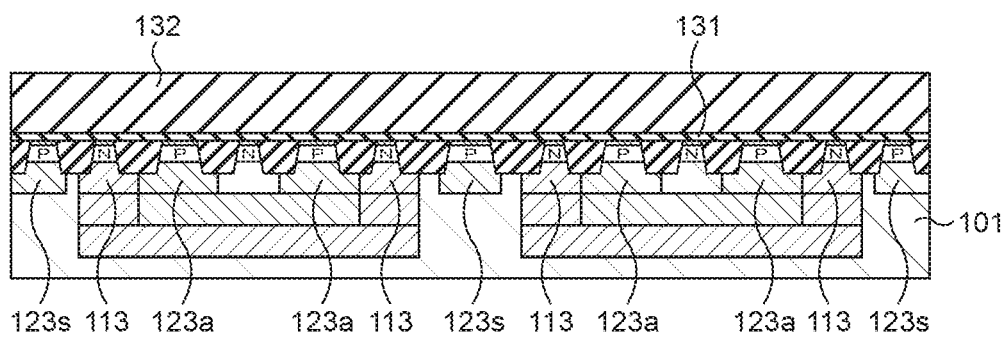
FIG. 7I is sectional views illustrating a manufacturing method of the semiconductor device according to the first embodiment in the order of processes continued from FIG. 7H.

After that, as illustrated in FIG. 7I, a silicon nitride film 131 and a silicon oxide film 132 are formed on the silicide layers 116a, 116c, 126a, and 126s, and the element isolation regions 102, and a surface of the silicon oxide film 132 is flattened by chemical mechanical polishing (CMP).

Figure 7J:
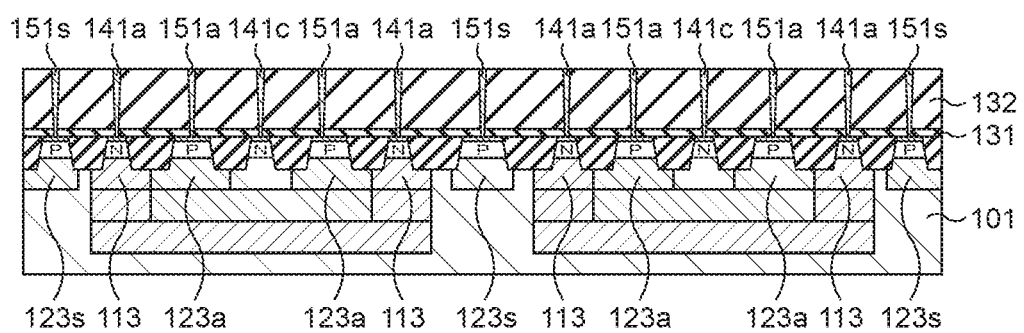
FIG. 7J is sectional views illustrating a manufacturing method of the semiconductor device according to the first embodiment in the order of processes continued from FIG. 7I.

Subsequently, as illustrated in FIG. 7J, conductive plugs 141a, 141c, 151a, and 151s are formed in the silicon oxide film 132 and the silicon nitride film 131. The conductive plug 141a is connected to the silicide layer 116a, the conductive plug 141c is connected to the silicide layer 116c, the conductive plug 151a is connected to the silicide layer 126a, and the conductive plug 151s is connected to the silicide layer 126s. As the conductive plugs 141a, 141c, 151a, and 151s, tungsten (W) plugs are formed, for example.

Figure 7K:
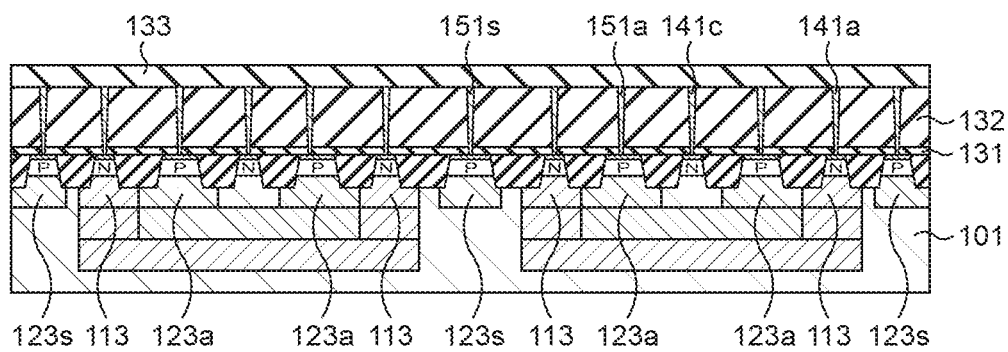
FIG. 7K is sectional views illustrating a manufacturing method of the semiconductor device according to the first embodiment in the order of processes continued from FIG. 7J.

Next, as illustrated in FIG. 7K, a silicon oxide film 133 is formed on the silicon oxide film 132.

Figure 7L:
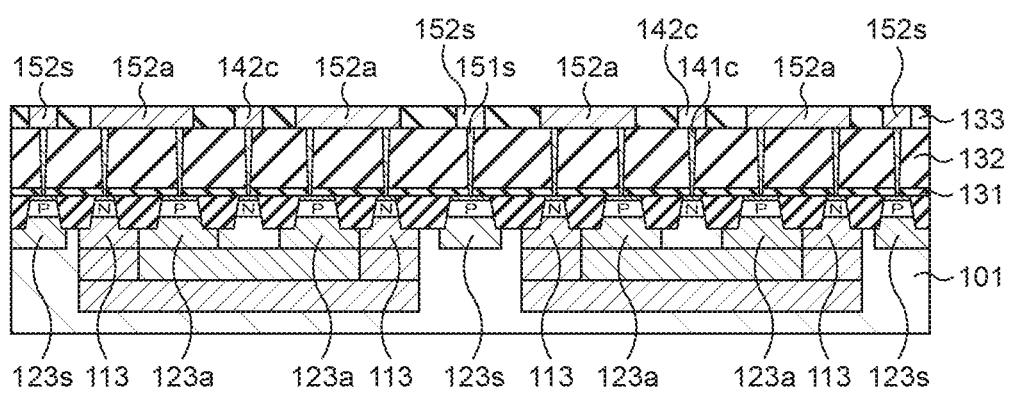
FIG. 7L is sectional views illustrating a manufacturing method of the semiconductor device according to the first embodiment in the order of processes continued from FIG. 7K.

After that, as illustrated in FIG. 7L, wires 142c, 152a, and 152s are formed in the silicon oxide film 133. The wire 142c is connected to the conductive plug 141c, the wire 152a is connected to the conductive plugs 141a and 151a, and the wire 152s is connected to the conductive plug 151s. At this time, between the plurality of first structures 105, the wires 142c are mutually connected in common, and the wires 152a are mutually connected in common. As the wires 142c, 152a, and 152s, copper (Cu) wires are formed, for example.

The semiconductor device according to the first embodiment can be manufactured in a manner as described above.

Second Embodiment

Figure 8A:
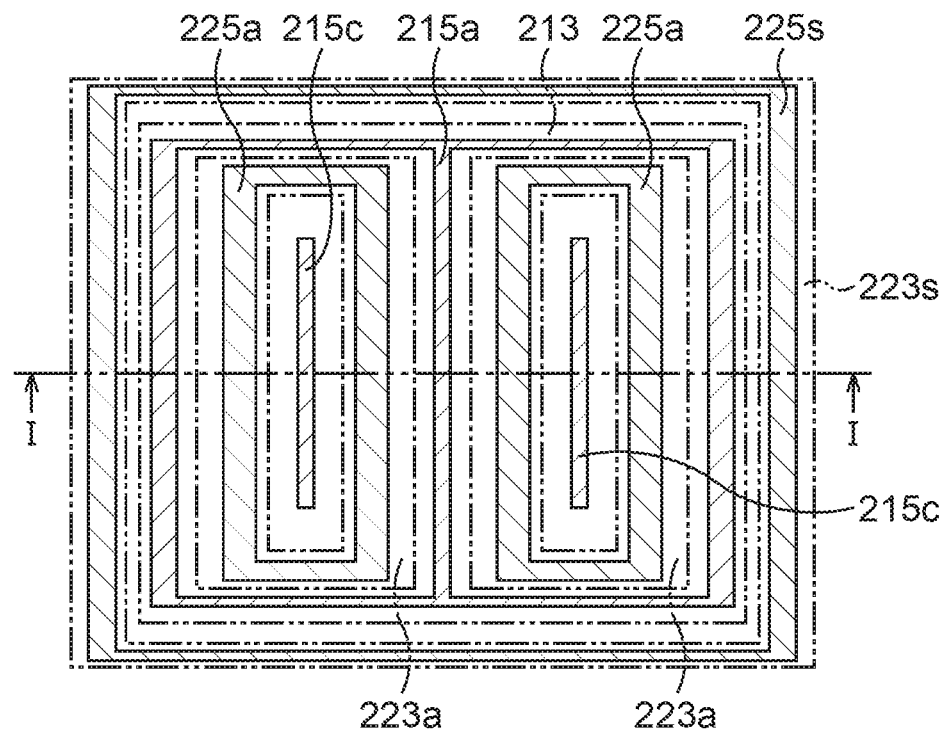
FIG. 8A and FIG. 8B are diagrams illustrating a layout of impurity diffusion layers and wells in a semiconductor device according to a second embodiment.
Figure 8B:
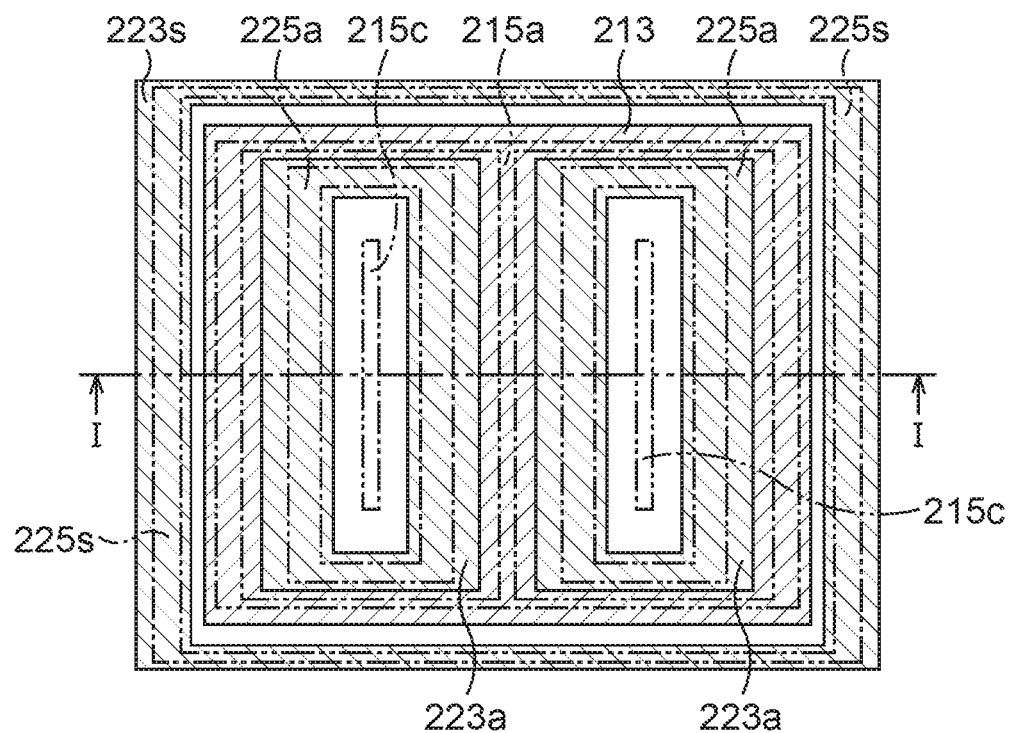
Figure 10:
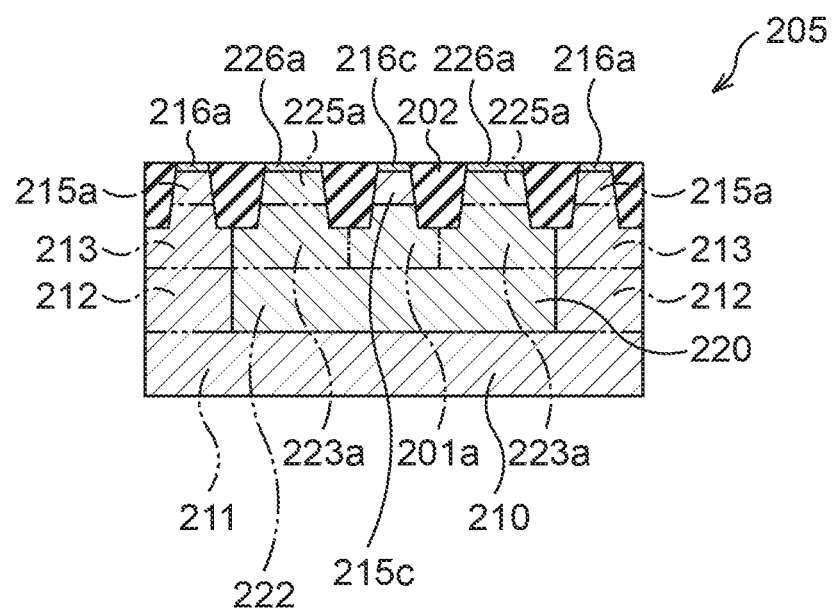
FIG. 10 is a sectional view illustrating a first structure included in the semiconductor device according to the second embodiment.

Next, a second embodiment will be described. The second embodiment relates to a semiconductor device including a diode. FIG. 8A and FIG. 8B are diagrams illustrating a layout of impurity diffusion layers and wells in the semiconductor device according to the second embodiment. FIG. 9 is a sectional view illustrating a configuration of the semiconductor device according to the second embodiment. FIG. 9 corresponds to a sectional view taken along a line I-I in FIG. 8A and FIG. 8B. FIG. 10 is a sectional view illustrating a first structure included in the semiconductor device according to the second embodiment.

As illustrated in FIGS. 8A and 8B and FIG. 9, the semiconductor device according to the second embodiment includes a plurality of first structures 205 formed on a P-type substrate 201. As illustrated in FIG. 10, each of the first structures 205 includes a first N-type region 210, a P-type region 220 surrounded by the first N-type region 210, and an N-type impurity diffusion layer 215c surrounded by the P-type region 220. The N-type region 210 includes an N-well 211, an N-well 212, an N-well 213, and an N-type impurity diffusion layer 215a, the P-type region 220 includes a P-well 222, a P-well 223a, and a P-type impurity diffusion layer 225a, and a portion 201a of the P-type substrate 201 is also included in the P-type region 220. In the first embodiment, the N-well 111 is independently provided for each of the first structures 105. On the contrary, in the second embodiment, the N-well 211 is provided in an integrated manner between the first structures 205. In accordance with the integration of the N-well 211, a part of the N-well 212 is shared between adjacent first structures 205. For each of the first structures 205, the N-well 212 is annularly formed on an outer peripheral portion of the N-well 211 having a substantially rectangular planar shape, the N-well 213 is formed on the N-well 212, and the N-type impurity diffusion layer 215a is formed on the N-well 213. The P-well 222 is formed on the N-well 211, at a position on the inside of the N-well 212 in plan view, the P-well 223a is annularly formed on an outer peripheral portion of the P-well 222, and the P-type impurity diffusion layer 225a is formed on the P-well 223a. At a position on the P-well 222 and on the inside of the P-well 223a in plan view, there is the portion 201a of the P-type substrate 201. The N-type impurity diffusion layer 215c is formed on the portion 201a of the P-type substrate 201. The N-type impurity diffusion layer 215c is one example of a second N-type region.

An element isolation region 202 is formed between adjacent impurity diffusion layers having different conductivity types. A silicide layer 216c is formed on the N-type impurity diffusion layer 215c, a silicide layer 216a is formed on the N-type impurity diffusion layer 215a, a silicide layer 226a is formed on the P-type impurity diffusion layer 225a, and a silicide layer 226s is formed on the P-type impurity diffusion layer 225s. On the silicide layers 216a, 216c, 226a, and 226s, and the element isolation regions 202, a silicon nitride film 231 and a silicon oxide film 232 are formed, and conductive plugs 241a, 241c, 251a, and 251s are formed in the silicon nitride film 231 and the silicon oxide film 232. The conductive plug 241a is connected to the silicide layer 216a, the conductive plug 241c is connected to the silicide layer 216c, the conductive plug 251a is connected to the silicide layer 226a, and the conductive plug 251s is connected to the silicide layer 226s. A silicon oxide film 233 is formed on the silicon oxide film 232, and wires 242c, 252a, and 252s are formed in the silicon oxide film 233. The wire 242c is connected to the conductive plug 241c, the wire 252a is connected to the conductive plugs 241a and 251a, and the wire 252s is connected to the conductive plug 251s. Specifically, in each of the first structures 205, the N-type region 210 and the P-type region 220 are wired through the wire 252a.

Between the plurality of first structures 205, the wires 242c are connected in common, and the wires 252a are connected in common. Specifically, between the plurality of first structures 205, pairs each formed of the N-type region 210 and the P-type region 220 are mutually connected in common, and the N-type impurity diffusion layers 215c are mutually connected in common. In a manner as described above, the plurality of first structures 205 are connected in parallel to form one diode 200.

In the semiconductor device according to the second embodiment, the P-type region 220 is surrounded by the first N-type region 210 in each of the first structures 205, so that a collector resistance in the diode 200 is not influenced by the number of the first structures 205. Therefore, it is possible to suppress an input loss, similarly to the first embodiment. In the second embodiment, a part of the first N-type region 210 is shared by adjacent first structures 205, so that the second embodiment is more suitable for high integration than the first embodiment.

Next, a manufacturing method of the semiconductor device according to the second embodiment will be described. FIG. 11A to FIG. 11L are sectional views illustrating the manufacturing method of the semiconductor device according to the second embodiment in the order of processes.

Figure 11A:
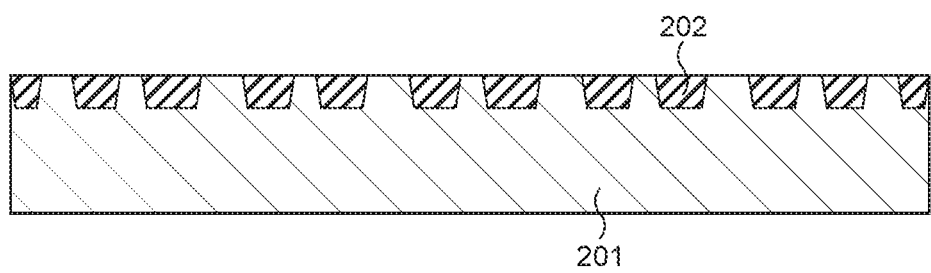
FIG. 11A is sectional views illustrating a manufacturing method of the semiconductor device according to the second embodiment in the order of processes.

First, as illustrated in FIG. 11A, element isolation regions 202 are formed on a surface of a substrate 201. The substrate 201 is a P-type silicon substrate, for example. The element isolation regions 202 can be formed through the STI, for example.

Figure 11B:
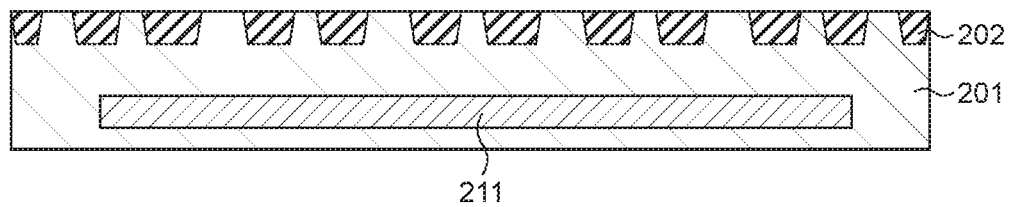
FIG. 11B is sectional views illustrating the manufacturing method of the semiconductor device in the order of processes continued from FIG. 11A.

Next, as illustrated in FIG. 11B, an N-well 211 is formed in the substrate 201. In the formation of the N-well 211, an ion implantation of P is performed at an implantation energy of 2 MeV to 4 MeV and a dose amount of $1.5 \times 10^{13}$ cm$^{-2}$ to $2.5 \times 10^{13}$ cm$^{-2}$, for example. An upper end of the N-well 211 having an impurity concentration of $1 \times 10^{16}$ cm$^{-3}$ or more is positioned at a depth of 1.37 µm to 2.46 µm from the surface of the substrate 201, and a lower end of the N-well 211 is positioned at a depth of 4.15 µm to 5.80 µm from the surface of the substrate 201.

Figure 11C:
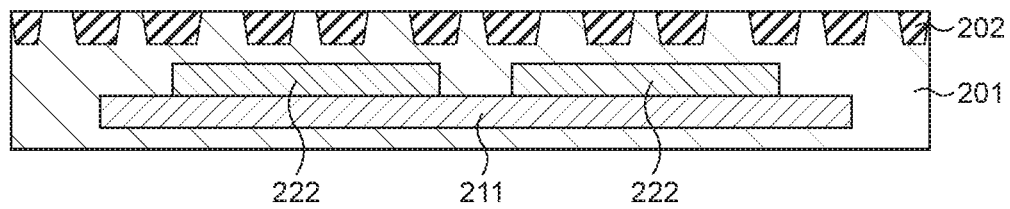
FIG. 11C is sectional views illustrating the manufacturing method of the semiconductor device in the order of processes continued from FIG. 11B.

After that, as illustrated in FIG. 11C, a P-well 222 is formed on the N-well 211. In the formation of the P-well 222, an ion implantation of B is performed at an implantation energy of 800 keV to 1000 keV and a dose amount of $0.5 \times 10^{13}$ cm$^{-2}$ to $1.5 \times 10^{13}$ cm$^{-2}$, for example. An upper end of the P-well 222 having an impurity concentration of $1 \times 10^{16}$ cm$^{-3}$ or more is positioned at a depth of 1.06 µm to 1.47 µm from the surface of the substrate 201, and a lower end of the P-well 222 is positioned at a depth of 2.05 µm to 2.31 µm from the surface of the substrate 201.

Figure 11D:
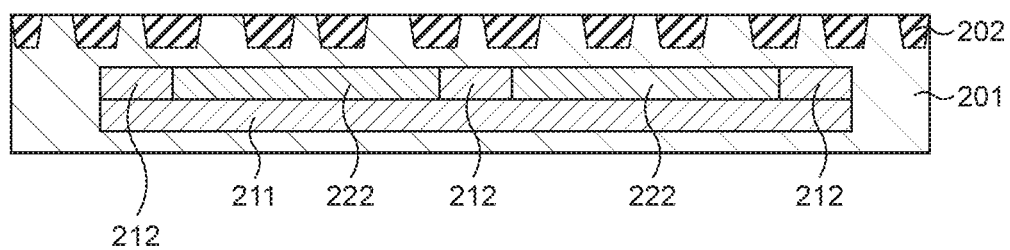
FIG. 11D is sectional views illustrating the manufacturing method of the semiconductor device in the order of processes continued from FIG. 11C.

Subsequently, as illustrated in FIG. 11D, an N-well 212 is formed on the N-well 211. In the formation of the N-well 212, an ion implantation of P is performed at an implantation energy of 600 keV to 800 keV and a dose amount of $1.0 \times 10^{13}$ cm$^{-2}$ to $2.0 \times 10^{13}$ cm$^{-2}$, for example. An upper end of the N-well 212 having an impurity concentration of $1 \times 10^{16}$ cm$^3$ or more is positioned at a depth of 0.25 µm to 0.51 µm from the surface of the substrate 201, and a lower end of the N-well 212 is positioned at a depth of 2.05 µm to 2.43 µm from the surface of the substrate 201.

Figure 11E:
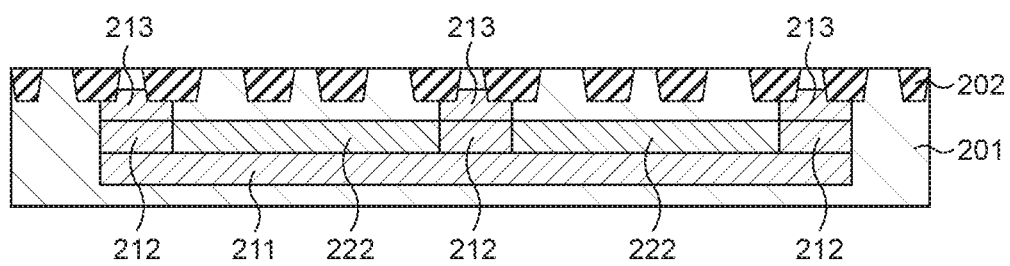
FIG. 11E is sectional views illustrating the manufacturing method of the semiconductor device in the order of processes continued from FIG. 11D.

Next, as illustrated in FIG. 11E, an N-well 213 is formed on the N-well 212. In the formation of the N-well 213, an ion implantation of P is performed at an implantation energy of 300 keV to 400 keV and a dose amount of $2.0 \times 10^{13}$ cm$^{-2}$ to $4.0 \times 10^{13}$ cm$^{-2}$, for example. An upper end of the N-well 213 having an impurity concentration of $1 \times 10^{16}$ cm$^{-3}$ or more is positioned at a depth of 0.00 µm from the surface of the substrate 201, and a lower end of the N-well 213 is positioned at a depth of 0.84 µm to 1.07 µm from the surface of the substrate 201.

Figure 11F:
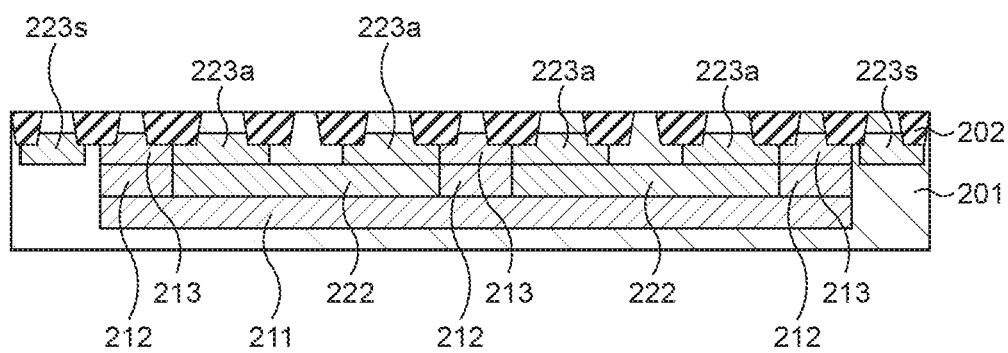
FIG. 11F is sectional views illustrating the manufacturing method of the semiconductor device in the order of processes continued from FIG. 11E.

After that, as illustrated in FIG. 11F, P-wells 223a are formed on the P-well 222, and a P-well 223s is formed to have a depth same as that of the P-well 223a. In the formation of the P-wells 223a and 223s, an ion implantation of B is performed at an implantation energy of 100 keV to 200 keV and a dose amount of $2.0 \times 10^{13}$ cm$^{-2}$ to $4.0 \times 10^{13}$ cm$^{-2}$, for example. An upper end of each of the P-wells 223a and 223s having an impurity concentration of $1 \times 10^{16}$ cm$^{-3}$ or more is positioned at a depth of 0.00 µm to 0.13 µm from the surface of the substrate 201, and a lower end of each of the P-wells 223a and 223s is positioned at a depth of 0.68 µm to 1.05 µm from the surface of the substrate 201. After the impurities are ion-implanted into the substrate 201, annealing called as well-annealing is performed. The well-annealing is performed for the purpose of obtaining a predetermined impurity concentration profile by causing thermal diffusion of the ion-implanted impurities, and is carried out for about 10 seconds at a high temperature of about 1000° C., for example. Even in a case where, for example, regions of mutual wells are not overlapped in a depth direction right after the implantation, it is possible to perform control to make the regions to be overlapped, through the thermal diffusion of the impurities.

Figure 11G:
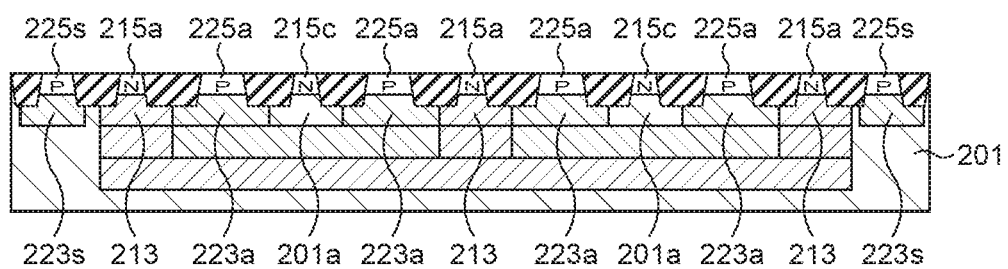
FIG. 11G is sectional views illustrating the manufacturing method of the semiconductor device in the order of processes continued from FIG. 11F.

Subsequently, as illustrated in FIG. 11G, an N-type impurity diffusion layer 215a is formed on the N-well 213, N-type impurity diffusion layers 215c are formed on portions 201a of the substrate 201, P-type impurity diffusion layers 225a are formed on the P-wells 223a, and a P-type impurity diffusion layer 225s is formed on the P-well 223s. In the formation of the N-type impurity diffusion layers 215a and 215c, an ion implantation of P is performed at an implantation energy of 6 keV to 10 keV and a dose amount of $1.0 \times 10^{16}$ cm$^{-2}$ to $1.5 \times 10^{16}$ cm$^{-2}$, for example. In the formation of the P-type impurity diffusion layers 225a and 225s, an ion implantation of B is performed at an implantation energy of 6 keV to 10 keV and a dose amount of $0.8 \times 10^{13}$ cm$^{-2}$ to $1.2 \times 10^{13}$ cm$^{-2}$, an ion implantation of Ge is performed at an implantation energy of 15 keV to 25 keV and a dose amount of $3.0 \times 10^{14}$ cm$^{-2}$ to $7.0 \times 10^{14}$ cm$^{-2}$, an ion implantation of B is performed at an implantation energy of 2 keV to 6 keV and a dose amount of $4.0 \times 10^{15}$ cm$^{-2}$ to $8.0\times10^{15}$ cm$^{-2}$, and an ion implantation of F is performed at an implantation energy of 5 keV to 9 keV and a dose amount of $3.0\times10^{14}$ cm$^{-2}$ to $7.0\times10^{14}$ cm$^{-2}$, for example. Further, by performing rapid heat treatment called as spike annealing, the entire impurity diffusion region is activated. The spike annealing is performed, for example, at a temperature of about 1000° C. for a short period of time in which the temperature is raised rapidly such that a standby time to achieve high temperature is about 0 seconds and the temperature is lowered rapidly.

Figure 11H:
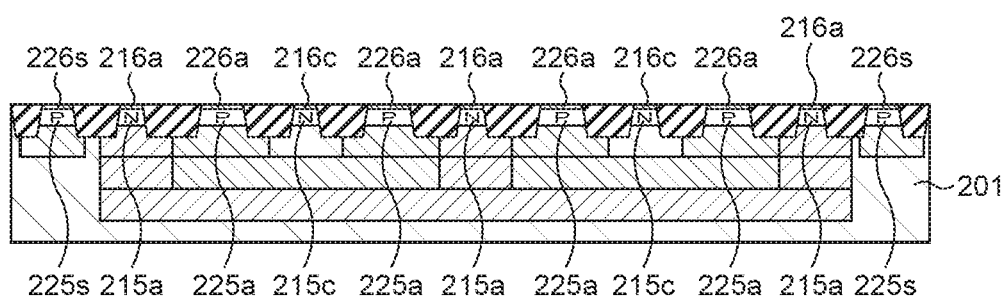
FIG. 11H is sectional views illustrating the manufacturing method of the semiconductor device in the order of processes continued from FIG. 11G.

Next, as illustrated in FIG. 11H, a silicide layer 216a is formed on the N-type impurity diffusion layer 215a, silicide layers 216c are formed on the N-type impurity diffusion layers 215c, silicide layers 226a are formed on the P-type impurity diffusion layers 225a, and a silicide layer 226s is formed on the P-type impurity diffusion layer 225s. As the silicide layers 216a, 216c, 226a, and 226s, for example, silicide layers each made of Mo, W, Ti, Co, or Ni are formed.

Figure 11I:
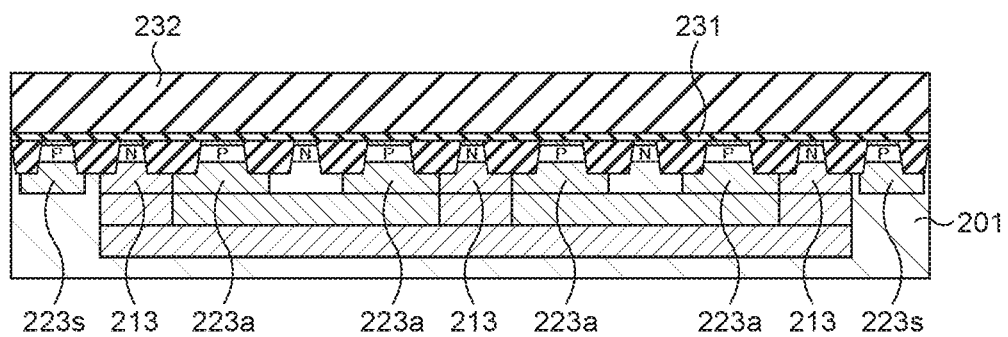
FIG. 11I is sectional views illustrating the manufacturing method of the semiconductor device in the order of processes continued from FIG. 11H.

After that, as illustrated in FIG. 11I, a silicon nitride film 231 and a silicon oxide film 232 are formed on the silicide layers 216a, 216c, 226a, and 226s, and the element isolation regions 202, and a surface of the silicon oxide film 232 is flattened by the CMP.

Figure 11J:
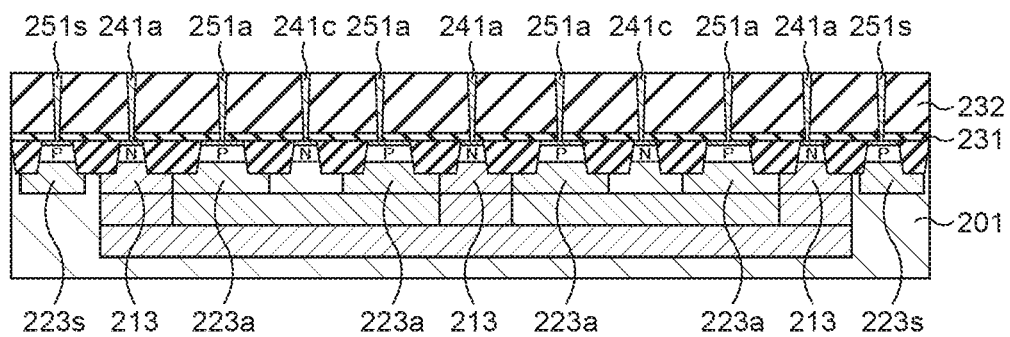
FIG. 11J is sectional views illustrating the manufacturing method of the semiconductor device in the order of processes continued from FIG. 11I.

Subsequently, as illustrated in FIG. 11J, conductive plugs 241a, 241c, 251a, and 251s are formed in the silicon oxide film 232 and the silicon nitride film 231. The conductive plug 241a is connected to the silicide layer 216a, the conductive plug 241c is connected to the silicide layer 216c, the conductive plug 251a is connected to the silicide layer 226a, and the conductive plug 251s is connected to the silicide layer 226s. As the conductive plugs 241a, 241c, 251a, and 251s, W plugs are formed, for example.

Figure 11K:
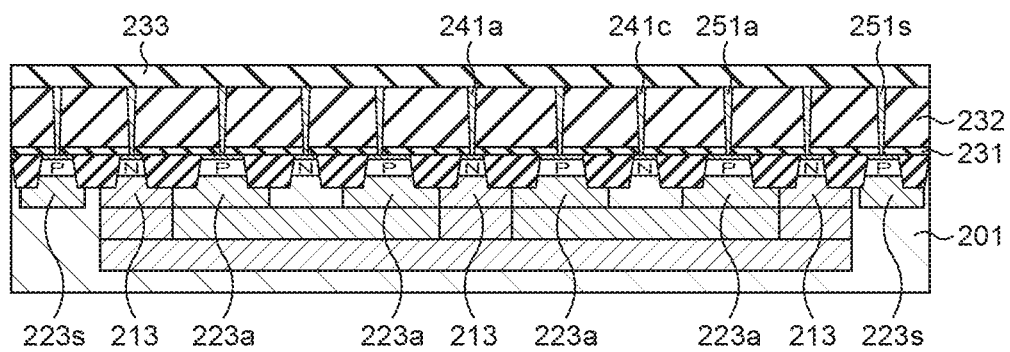
FIG. 11K is sectional views illustrating the manufacturing method of the semiconductor device in the order of processes continued from FIG. 11J.

Next, as illustrated in FIG. 11K, a silicon oxide film 233 is formed on the silicon oxide film 232.

Figure 11L:
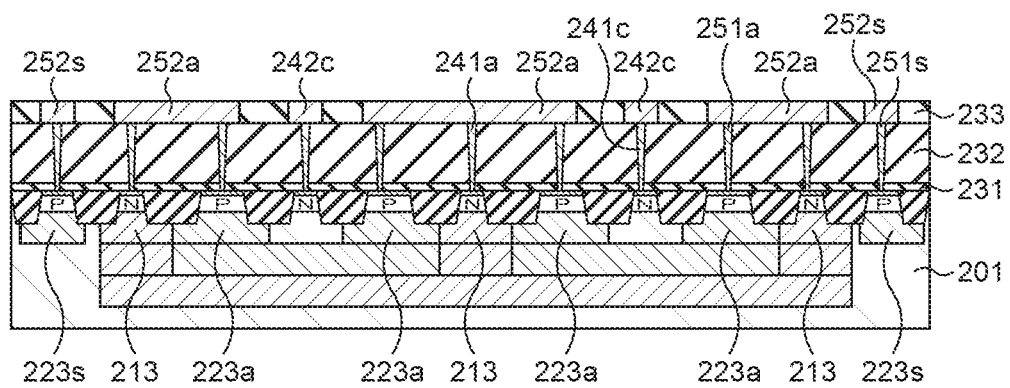
FIG. 11L is sectional views illustrating the manufacturing method of the semiconductor device in the order of processes continued from FIG. 11K.

After that, as illustrated in FIG. 11L, wires 242c, 252a, and 252s are formed in the silicon oxide film 233. The wire 242c is connected to the conductive plug 241c, the wire 252a is connected to the conductive plugs 241a and 251a, and the wire 252s is connected to the conductive plug 251s. At this time, between the plurality of first structures 205, the wires 242c are mutually connected in common, and the wires 252a are mutually connected in common.

The semiconductor device according to the second embodiment can be manufactured in a manner as described above.

Figure 12A:
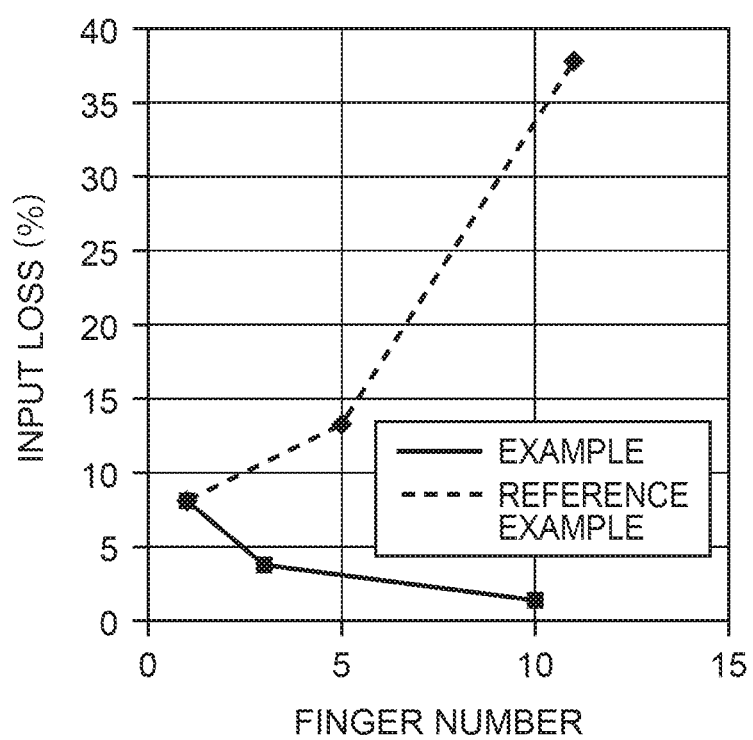
FIG. 12A and FIG. 12B are diagrams illustrating results of simulations regarding the second embodiment and the reference example.
Figure 12B:
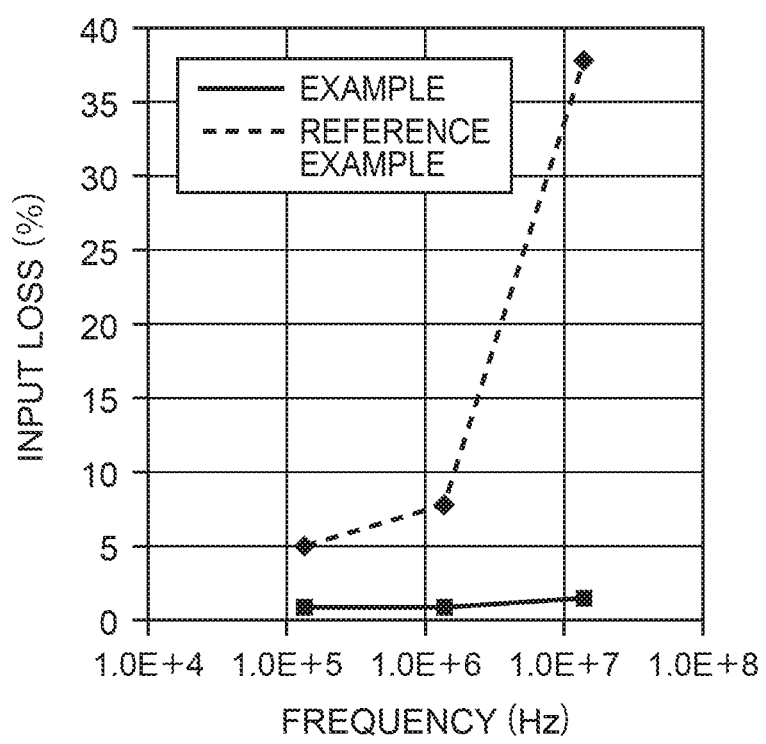
Figure 13A:
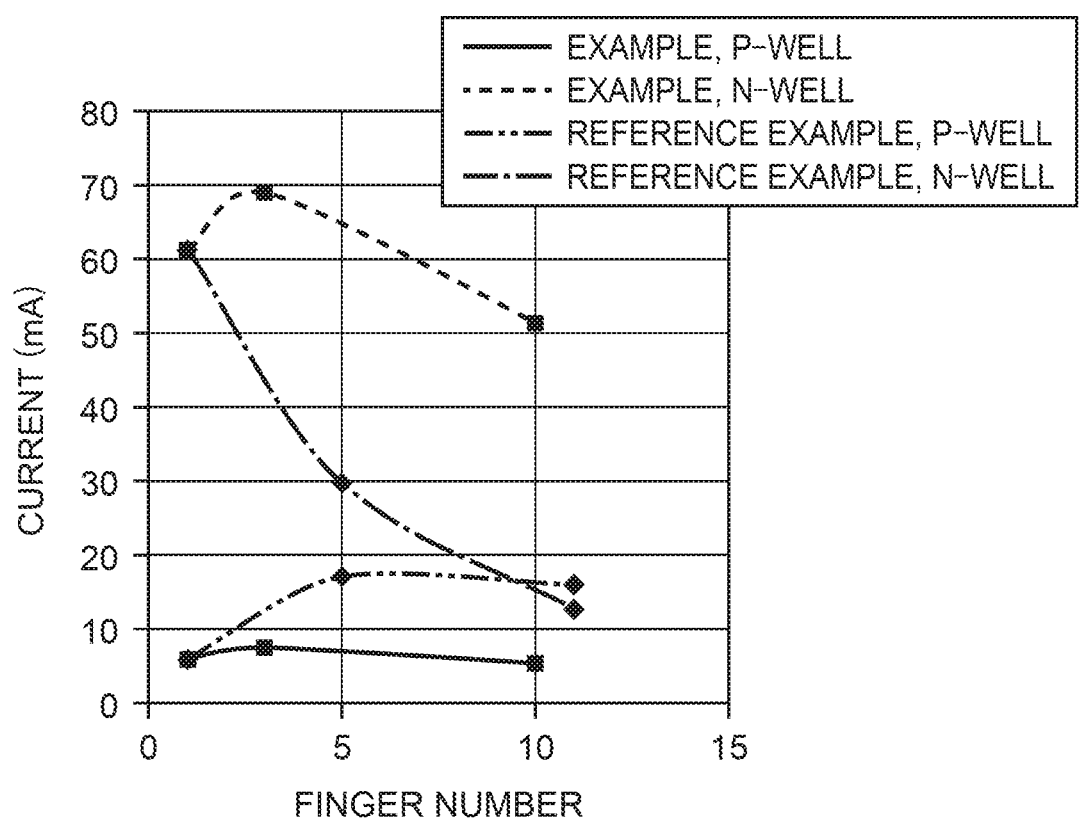
FIG. 13A and FIG. 13B are diagrams illustrating results of other simulations regarding the second embodiment and the reference example.
Figure 13B:
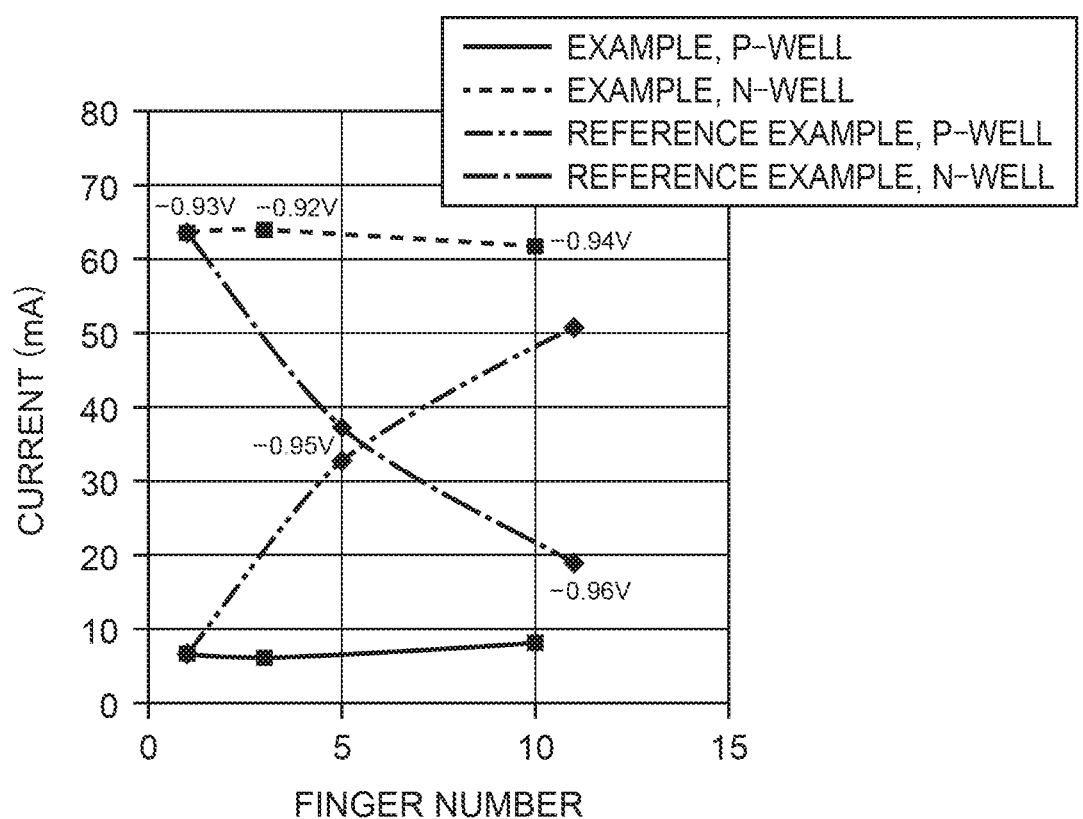

Next, simulations regarding the second embodiment will be described. FIGS. 12A and 12B and FIGS. 13A and 13B are diagrams illustrating results of simulations regarding the second embodiment (example) and the reference example. FIG. 12A is a diagram illustrating a relationship between a finger number and an input loss, and FIG. 12B is a diagram illustrating a relationship between a frequency and an input loss. FIG. 13A is a diagram illustrating a relationship between a finger number and a current when a cathode voltage is constant, and FIG. 13B is a diagram illustrating a relationship between a finger number and a current when an input current is constant. In the diode 200 of the second embodiment, the finger number, namely, the number of the N-type impurity diffusion layers 215c is two, but, FIG. 12A and FIGS. 13A and 13B illustrate results when the finger number is 1, 3, or 10. Further, FIG. 12B illustrates a result when the finger number is 10 regarding the second embodiment, and illustrates a result when the finger number is 11 regarding the reference example.

In the simulations illustrated in FIGS. 12A and 12B, the diodes with the layout such as in the second embodiment or the reference example were set to be used as the diodes D1 to D4 in the full-wave rectifier circuit in FIG. 3A. In the simulation illustrated in FIG. 12A, a total area per one diode was set to 3000 μm$^2$, a resistance of the resistor element R was set to 539Ω, a capacitance of the capacitor element C was set to 200 pF, and an alternating current having a frequency of 13.56 MHz and a maximum value of 70 mA was applied between the input terminals IN1 and IN2. In the simulation illustrated in FIG. 12B, a total area per one diode was set to 3000 μm$^2$, a resistance of the resistor element R was set to 539Ω, a capacitance of the capacitor element C was set to 200 pF, and an alternating current having a maximum value of 70 mA was applied between the input terminals IN1 and IN2, in which a frequency of the alternating current was changed.

As illustrated in FIG. 12A, the input loss greatly increases in accordance with the increase in the finger number in the reference example, and on the contrary, the input loss decreases in accordance with the increase in the finger number in the second embodiment. As illustrated in FIG. 12B, the input loss greatly increases in accordance with the increase in the frequency in the reference example, and on the contrary, the input loss does not change almost at all even if the frequency increases in the second embodiment. As described above, according to the second embodiment, it is possible to avoid the increase in the input loss even if the finger number is increased or even if the frequency is increased.

In the simulation illustrated in FIG. 13A, a cathode voltage was set to −0.92 V, an anode voltage was set to 0 V, a substrate voltage was set to −30 V, and a current flowed from the P-well to the N-type impurity diffusion layer and a current flowed from the N-well to the N-type impurity diffusion layer caused by the NPN bipolar transistor were calculated. In the simulation illustrated in FIG. 13B, an anode voltage was set to 0 V, a substrate voltage was set to −30 V, a cathode voltage was adjusted to realize an effective value of an input current of 70 mA, and a current flowed from the P-well to the N-type impurity diffusion layer and a current flowed from the N-well to the N-type impurity diffusion layer were calculated. A numeric value in FIG. 13B indicates a cathode voltage.

As illustrated in FIGS. 13A and 13B, the current flowed from the N-well greatly reduces in accordance with the increase in the finger number in the reference example, and on the contrary, a variation of the current flowed from the N-well is small in the second embodiment. This is because, although the collector resistance greatly increases in the reference example, the collector resistance does not change almost at all in the second embodiment. Further, in the reference example, the cathode voltage which is necessary to realize 70 mA of the input current increases in accordance with the increase in the finger number, which causes the increases in the input loss.

In the first embodiment and the second embodiment, the first N-type region and the P-type region are wired through the wire, but, it is also possible that the first N-type region and the P-type region are wired through the impurity diffusion layer. For example, when the number of layers forming the diode element is reduced, there is no need to secure a region of a layer of wire for the diode element, so that it is possible to use the region of the layer of wire for another application or the like. It is helpful to reduce the number of layers forming the diode element in the respect that the degree of freedom of design of the semiconductor device can be increased.

According to the above-described semiconductor device and the like, a plurality of appropriate first structures are connected in parallel to form one diode, so that it is possible to obtain an excellent rectification characteristic regardless of a frequency of an input signal.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A semiconductor device, comprising
a plurality of first structures, wherein:
each of the first structures includes:
a first N-type region;
a P-type region which is surrounded by the first N-type region; and
a second N-type region which is surrounded by the P-type region;
a plurality of the first N-type region and a plurality of the P-type region are mutually wired in common between the plurality of first structures as an anode by a wire;
a plurality of the second N-type regions are mutually wired in common between the plurality of first structures as a cathode by the wire; and
the plurality of first structures are connected in parallel to form one diode.

2. The semiconductor device according to claim 1, wherein
a part of the first N-type region is shared between adjacent first structures in the plurality of first structures.

3. The semiconductor device according to claim 1, further comprising
four diodes which are connected in a bridge configuration to form a full-wave rectifier circuit, wherein at least one of the four diodes includes the plurality of first structures.

4. The semiconductor device according to claim 3, wherein the four diodes include the plurality of first structures.

5. The semiconductor device according to claim 3, wherein a frequency of an input signal to the bridge configuration is 10 MHz or more.

6. A semiconductor device, comprising
a first structure, wherein:
the first structure includes:
a first N-type region;
a first P-type region which is surrounded by the first N-type region; and
a second N-type region which is surrounded by the first P-type region;
a second structure, wherein:
the second structure includes:
a third N-type region;
a second P-type region which is surrounded by the third N-type region; and
a fourth N-type region which is surrounded by the second P-type region;
wherein:
the first N-type region, the first P-type region, the third N-type region and the second P-type region are mutually wired in common between the first structure and the second structure as an anode by a wire;
the second N-type region and the fourth N-type region are mutually wired in common between the first structure and the second structure as a cathode by the wire; and
the first structure and the second structure are connected in parallel to form a diode.

7. The semiconductor device according to claim 6, wherein a part of the first N-type region and a part of the third N-type region is shared between the first structures and the second structure.

8. The semiconductor device according to claim 6, further comprising
four diodes which are connected in a bridge configuration to form a full-wave rectifier circuit, wherein at least one of the four diodes includes the first structure and the second structure.

9. The semiconductor device according to claim 8, wherein the four diodes include the first structure and the second structure.

10. The semiconductor device according to claim 8, wherein a frequency of an input signal to the bridge configuration is 10 MHz or more.

* * * * *